(12) United States Patent
Lee et al.

(10) Patent No.: US 11,362,031 B2
(45) Date of Patent: Jun. 14, 2022

(54) INTEGRATED CIRCUIT DEVICE AND METHOD OF MANUFACTURING THE SAME

(71) Applicant: Samsung Electronics Co., Ltd., Suwon-si (KR)

(72) Inventors: Choonghyun Lee, Seoul (KR); Joonyong Choe, Hwaseong-si (KR); Youngju Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 139 days.

(21) Appl. No.: 16/809,629

(22) Filed: Mar. 5, 2020

(65) Prior Publication Data

US 2021/0057339 A1 Feb. 25, 2021

(30) Foreign Application Priority Data

Aug. 21, 2019 (KR) .......................... 10-2019-0102456

(51) Int. Cl.
*H01L 23/522* (2006.01)
*H01L 27/108* (2006.01)
*H01L 21/768* (2006.01)

(52) U.S. Cl.
CPC .... *H01L 23/5228* (2013.01); *H01L 21/76805* (2013.01); *H01L 23/5226* (2013.01); *H01L 27/10885* (2013.01)

(58) Field of Classification Search
CPC ........... H01L 23/5228; H01L 21/76805; H01L 23/5226; H01L 27/10885
See application file for complete search history.

(56) References Cited

U.S. PATENT DOCUMENTS

| 7,033,955 | B2 | 4/2006 | Nam et al. | |
|---|---|---|---|---|
| 9,093,555 | B2 | 7/2015 | Riley et al. | |
| 2008/0237562 | A1* | 10/2008 | Chen | H01L 45/16 257/3 |
| 2011/0210401 | A1 | 9/2011 | Junker et al. | |
| 2015/0214479 | A1* | 7/2015 | Lung | H01L 45/12 365/163 |

(Continued)

FOREIGN PATENT DOCUMENTS

| KR | 10-2004-0083758 A | 10/2004 |
|---|---|---|
| KR | 10-2007-0087756 A | 8/2007 |
| KR | 10-0968420 B1 | 7/2010 |

*Primary Examiner* — Fernando L Toledo
*Assistant Examiner* — Neil R Prasad
(74) *Attorney, Agent, or Firm* — Muir Patent Law, PLLC

(57) ABSTRACT

An integrated circuit device includes a conductive line including a metal layer and an insulation capping structure covering the conductive line. The first insulation capping structure includes a first insulation capping pattern that is adjacent to the metal layer in the insulation capping structure and has a first density, and a second insulation capping pattern spaced apart from the metal layer with the first insulation capping pattern therebetween and having a second density that is greater than the first density. In order to manufacture the integrated circuit device, the conductive line having a metal layer is formed on a substrate, a first insulation capping layer having the first density is formed directly on the metal layer, and a second insulation capping layer having the second density that is greater than the first density is formed on the first insulation capping layer.

20 Claims, 31 Drawing Sheets

(56) References Cited

U.S. PATENT DOCUMENTS

| | | | |
|---|---|---|---|
| 2015/0279468 A1* | 10/2015 | Lee | H01L 27/11568 |
| | | | 365/185.18 |
| 2017/0005099 A1 | 1/2017 | Lee et al. | |
| 2018/0190662 A1 | 7/2018 | Wu et al. | |
| 2020/0066729 A1* | 2/2020 | Simsek-Ege | G11C 11/4087 |
| 2020/0126996 A1* | 4/2020 | Panda | H01L 21/0337 |

* cited by examiner

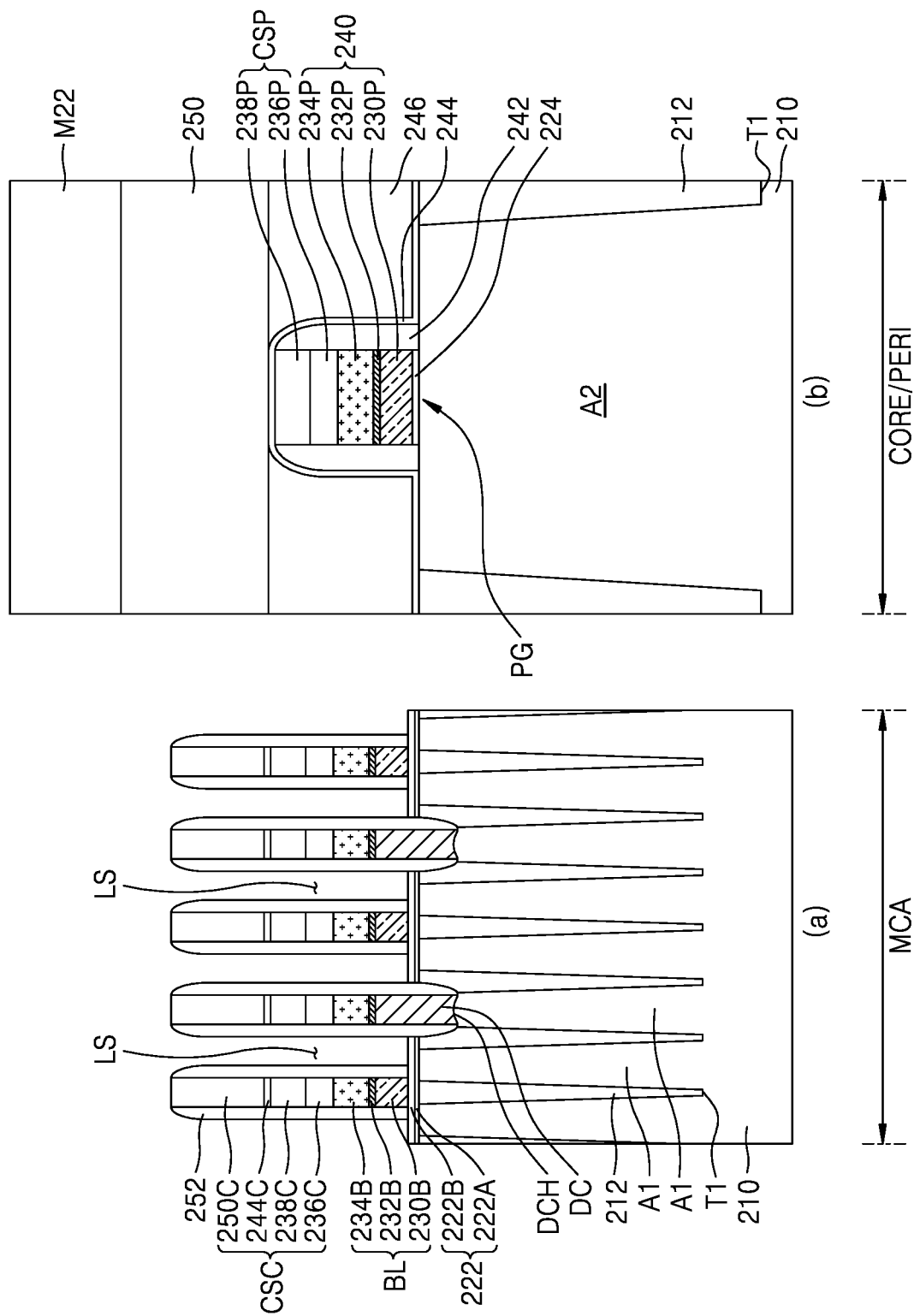

INTEGRATED CIRCUIT DEVICE AND METHOD OF MANUFACTURING THE SAME

CROSS-REFERENCE TO RELATED APPLICATION

This application claims priority under 35 U.S.C. § 119 to Korean Patent Application No. 10-2019-0102456, filed on Aug. 21, 2019, in the Korean Intellectual Property Office, the disclosure of which is incorporated herein in its entirety by reference.

BACKGROUND

The inventive concept relates to an integrated circuit device and a method of manufacturing the integrated circuit device, and in particular, to an integrated circuit device including bit lines.

As integrated circuit devices have been scaling-down rapidly, intervals among a plurality of wiring lines are reduced, and an area occupied by the plurality of wiring lines and a plurality of conductive structures interposed among the plurality of wiring lines is also reduced. Thus, it is difficult to secure a sufficient contact area among the plurality of wiring lines and the plurality of conductive structures. Accordingly, it is desirable to develop a structure capable of restraining increase in resistances of wiring lines that are densely arranged within a limited area and a method of implementing the structure.

SUMMARY

According to an aspect of the inventive concept, there is provided an integrated circuit device having a structure capable of restraining increase in resistances of wiring lines that are densely arranged within a limited area in the integrated circuit device having a fine unit cell size according to down-scaling of the integrated circuit device.

According to another aspect of the inventive concept, there is provided a method of manufacturing an integrated circuit device having a structure capable of restraining increase in resistances of wiring lines that are densely arranged within a limited area in the integrated circuit device having a fine unit cell size according to down-scaling of the integrated circuit device.

According to an embodiment, there is provided an integrated circuit device including a conductive line formed on a substrate, the conductive line including a metal layer and extending in a first horizontal direction with respect to an upper surface of the substrate, and an insulation capping structure covering the conductive line, wherein the insulation capping structure includes a first insulation capping pattern having a first density, the first insulation capping pattern being adjacent to the metal layer, and a second insulation capping pattern vertically spaced apart from the metal layer with the first insulation capping pattern therebetween, the second insulation capping pattern having a second density that is greater than the first density.

According to another embodiment, there is provided an integrated circuit device including: a pair of bit lines extending on a substrate in parallel to each other in a first horizontal direction with respect to an upper surface of the substrate and the pair of bit lines being adjacent to each other in a second horizontal direction with respect to the upper surface of the substrate; a pair of insulation capping structures covering the pair of bit lines, respectively; and a contact structure extending in a vertical direction from between the pair of bit lines to between the pair of insulation capping structures, wherein the pair of bit lines each includes a metal layer, and each of the pair of insulation capping structures includes a first insulation capping pattern on the metal layer, the first insulation capping pattern having a first density, and a second insulation capping pattern spaced apart from the metal layer with the first insulation capping pattern therebetween, the second insulation capping pattern having a second density that is greater than the first density.

According to another embodiment, there is provided an integrated circuit device including a substrate including a cell array area and a peripheral circuit area, a bit line on the substrate in the cell array area, the bit line including a first metal layer, a first insulation capping structure covering the bit line in the cell array area, a gate electrode on the substrate in the peripheral circuit area, the gate electrode including a second metal layer, and a second insulation capping structure covering the gate electrode in the peripheral circuit area, wherein each of the first insulation capping structure and the second insulation capping structure includes a first insulation capping pattern having a first density, and a second insulation capping pattern spaced apart from the substrate with the first insulation capping pattern therebetween, the second insulation capping pattern having a second density that is greater than the first density, and the first metal layer is in contact with the first insulation capping pattern included in the first insulation capping structure, and the first metal layer includes a first region doped with nitrogen (N) atoms, the first region extending from an interface between the first metal layer and the first insulation capping pattern in the first insulation capping structure toward the second insulation capping pattern and having a partial thickness of the first metal layer.

According to another embodiment, there is provided a method of manufacturing an integrated circuit device, the method including forming a conductive line on a substrate, the conductive line comprising a metal layer. An insulation capping structure is formed on the conductive line, the insulation capping structure includes a plurality of insulation capping patterns. The forming of the insulation capping structure includes forming a first insulation capping layer directly on the metal layer, the first insulation capping layer having a first density. A second insulation capping layer is formed on the first insulation capping layer, the second insulation capping layer has a second density that is greater than the first density.

According to another embodiment, there is provided a method of manufacturing an integrated circuit device, the method including forming a plurality of conductive layers stacked on a substrate, the plurality of conductive layers having a metal layer as an uppermost layer of the plurality of conductive layers. An insulation capping structure is formed on the metal layer, the insulation capping structure includes a first insulation capping pattern having a first density and a second insulation capping pattern having a second density that is greater than the first density. Bit lines are formed by etching the plurality of conductive layers by using the insulation capping structure as an etching mask.

According to another embodiment, there is provided a method of an integrated circuit device, the method including forming a plurality of conductive layers on a substrate in a cell array area and a peripheral circuit area, the plurality of conductive layers including a metal layer as an uppermost conductive layer of the plurality of conductive layers. A first insulation capping structure including a first insulation capping pattern, the first insulation capping pattern having a first density, and a second insulation capping pattern having a second density that is greater than the first density, are formed on the plurality of conductive layers in the cell array area. A second insulation capping structure including a third insulation capping pattern, the third insulation capping pattern having the first density, and a fourth insulation capping pattern having the second density is formed on the plurality of conductive layer in the peripheral circuit area. Bit lines are formed by etching the plurality of conductive layers by using the first insulation capping structure as an etching mask in the cell array area. A gate electrode is formed by etching the plurality of conductive layers by using the second insulation capping structure as an etching mask in the peripheral circuit area.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
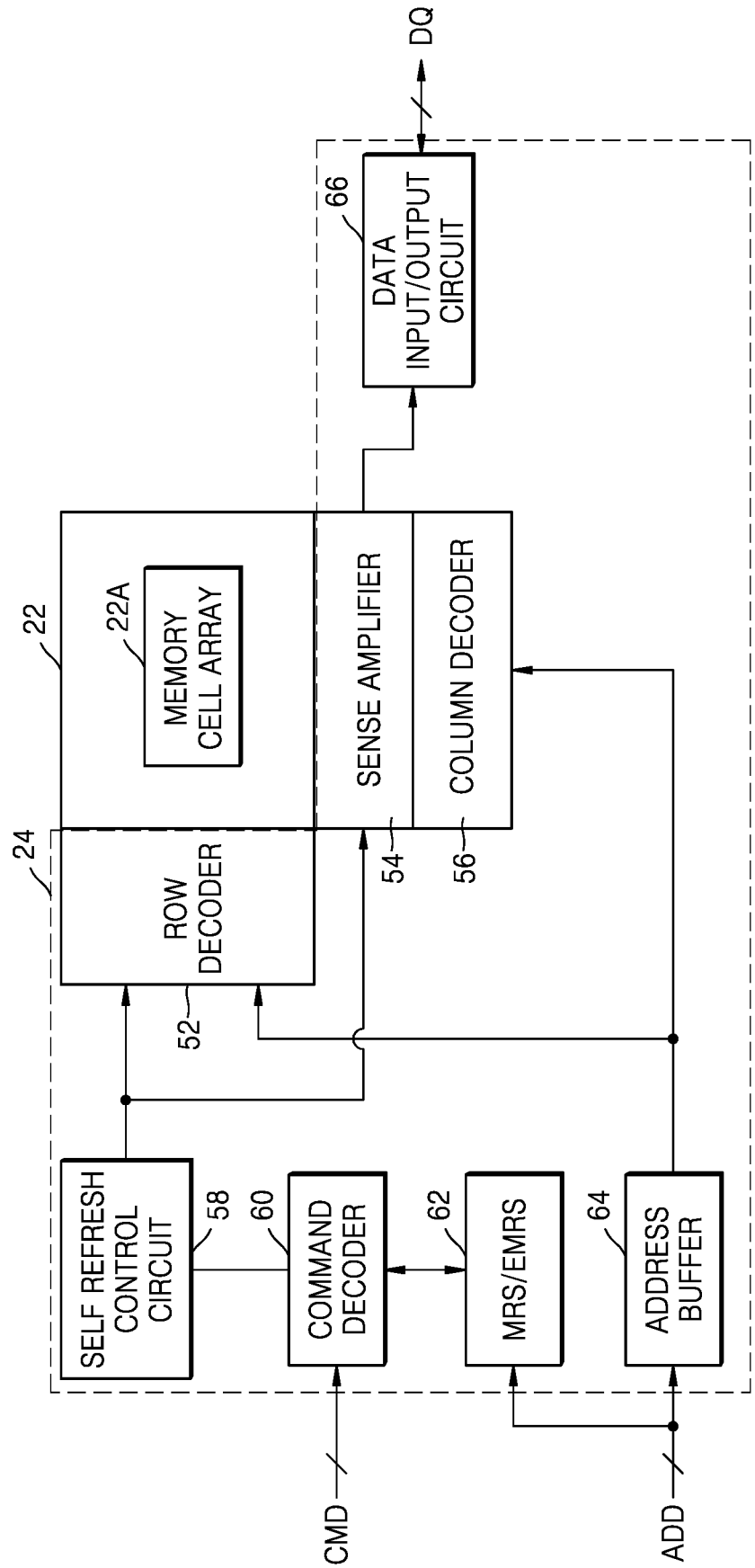
FIG. 1 is a block diagram of an integrated circuit device according to an embodiment of the inventive concept.

Hereinafter, one or more embodiments will be described in detail with reference to accompanying drawings. Like reference numerals denote the same elements on the drawings, and detailed descriptions thereof are omitted.

FIG. 1 is a block diagram of an integrated circuit device 100 according to one or more embodiments. FIG. 1 shows an example of the integrated circuit device 100 that includes a dynamic random access memory (DRAM) device.

Referring to FIG. 1, the integrated circuit device 100 includes a first area 22 and a second area 24. The first area 22 may be a memory cell area of the DRAM device, and the second area 24 may be a peripheral circuit area of the DRAM device. The first area 22 may include a memory cell array 22A. In the memory cell array 22A, a plurality of memory cells for storing data may be arranged in row and column directions. The second area 24 may include a row decoder 52, a sense amplifier 54, a column decoder 56, a self-refresh control circuit 58, a command decoder 60, a mode register set/extended mode register set (MRS/EMRS) circuit 62, an address buffer 64, and a data input/output circuit 66.

Figure 2:
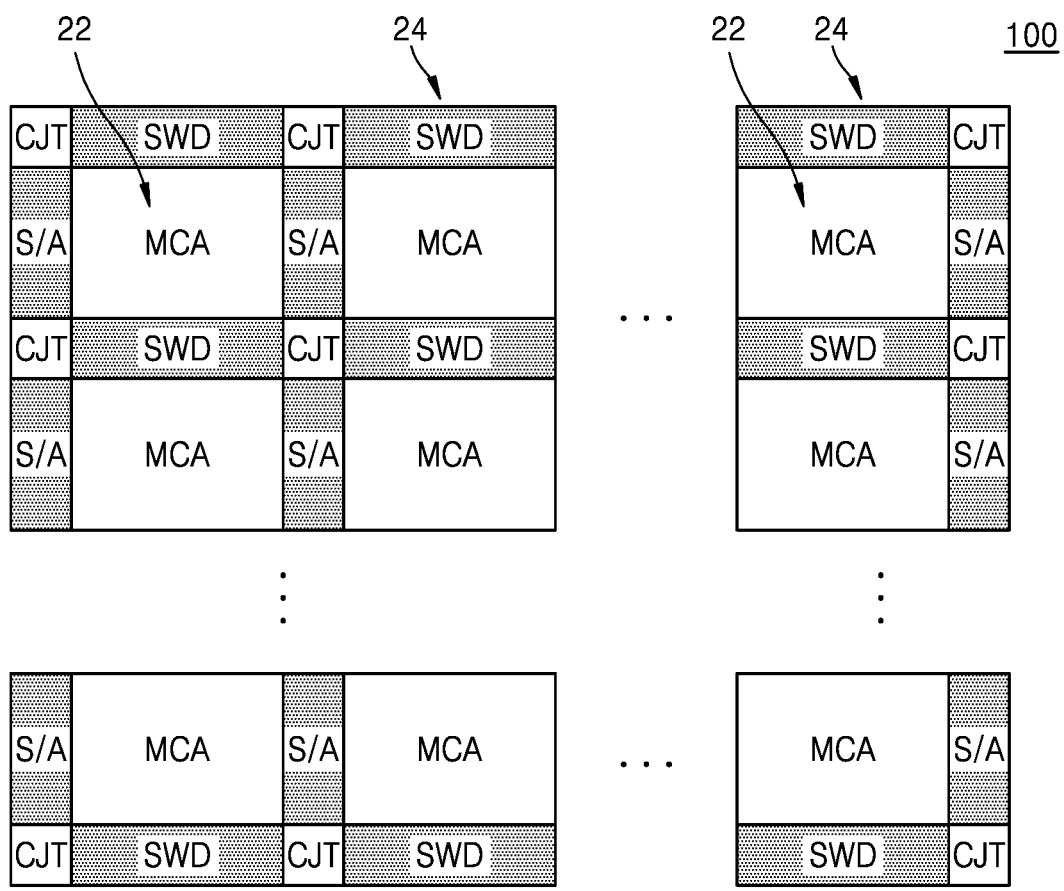
FIG. 2 is a plan view showing an example of an arrangement in an integrated circuit device according to an embodiment of the inventive concept.

FIG. 2 is a plan view illustrating an exemplary arrangement structure of the integrated circuit device 100 of FIG. 1.

Referring to FIG. 2, the integrated circuit device 100 includes a plurality of first areas 22. Each of the plurality of first areas 22 may be surrounded by the second area 24. Each of the plurality of first areas 22 may include a cell array area MCA of the DRAM device, and the second area 24 may include an area for forming peripheral circuits of the DRAM device and a core area (hereinafter, referred to as "peripheral circuit area"). In the plurality of first areas 22, the cell array area MCA may include the memory cell array 22A described above with reference to FIG. 1.

The second area 24 may include a sub-word line driver block SWD, a sense amplifier block S/A, and a conjunction block CJT. In the sense amplifier block S/A, a plurality of bit line sense amplifiers may be arranged. The conjunction block CJT may be at a point where the sub-word line driver block SWD and the sense amplifier block S/A intersect with each other. In the conjunction block CJT, power drivers for driving the bit line sense amplifiers and ground drivers may be alternately arranged. In the second area 24, peripheral circuits such as an inverter chain, an input/output circuit, etc. may be further formed.

Figure 3:
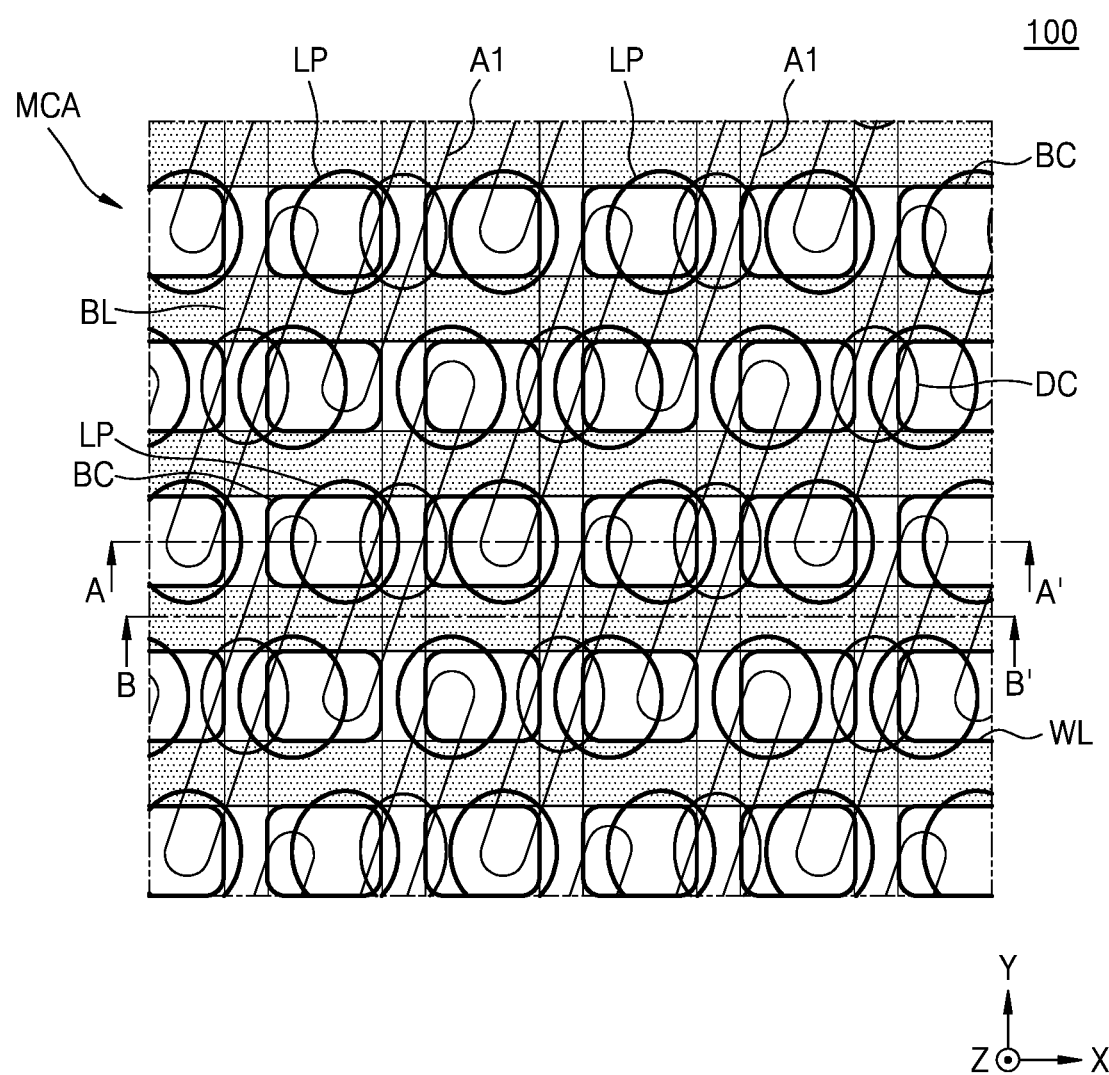
FIG. 3 is a layout illustrating elements in a cell array region of an integrated circuit device of FIG. 2 according to an embodiment of the inventive concept.

FIG. 3 is a layout for illustrating elements of the cell array area MCA shown in FIG. 2.

Referring to FIG. 3, the cell array area MCA may include a plurality of cell active areas A1. Each of the plurality of cell active areas A1 may be arranged to have a major axis in a diagonal direction with respect to a first horizontal direction (X-direction) and a second horizontal direction (Y-direction). A plurality of word lines WL may extend in parallel with each other in the X-direction crossing the plurality of cell active areas A1. A plurality of bit lines BL may extend in parallel with one another in the second horizontal direction (Y-direction) on the plurality of word lines WL. The plurality of bit lines BL may be connected to the plurality of cell active areas A1 via direct contacts DC. A plurality of buried contacts BC may be formed between two adjacent bit lines from among the plurality of bit lines BL. The plurality of buried contacts BC may be arranged in a row along the first horizontal direction (X-direction) and the second horizontal direction (Y-direction). A plurality of conductive landing pads LP may be formed on the plurality of buried contacts BC, respectively. The plurality of buried contacts BC and the plurality of conductive landing pads LP may connect lower electrodes (not shown) of capacitors formed on the plurality of bit lines BL to the cell active areas A1. Each of the plurality of conductive landing pads LP may partially overlap a corresponding one of the buried contacts BC.

Figure 4A:
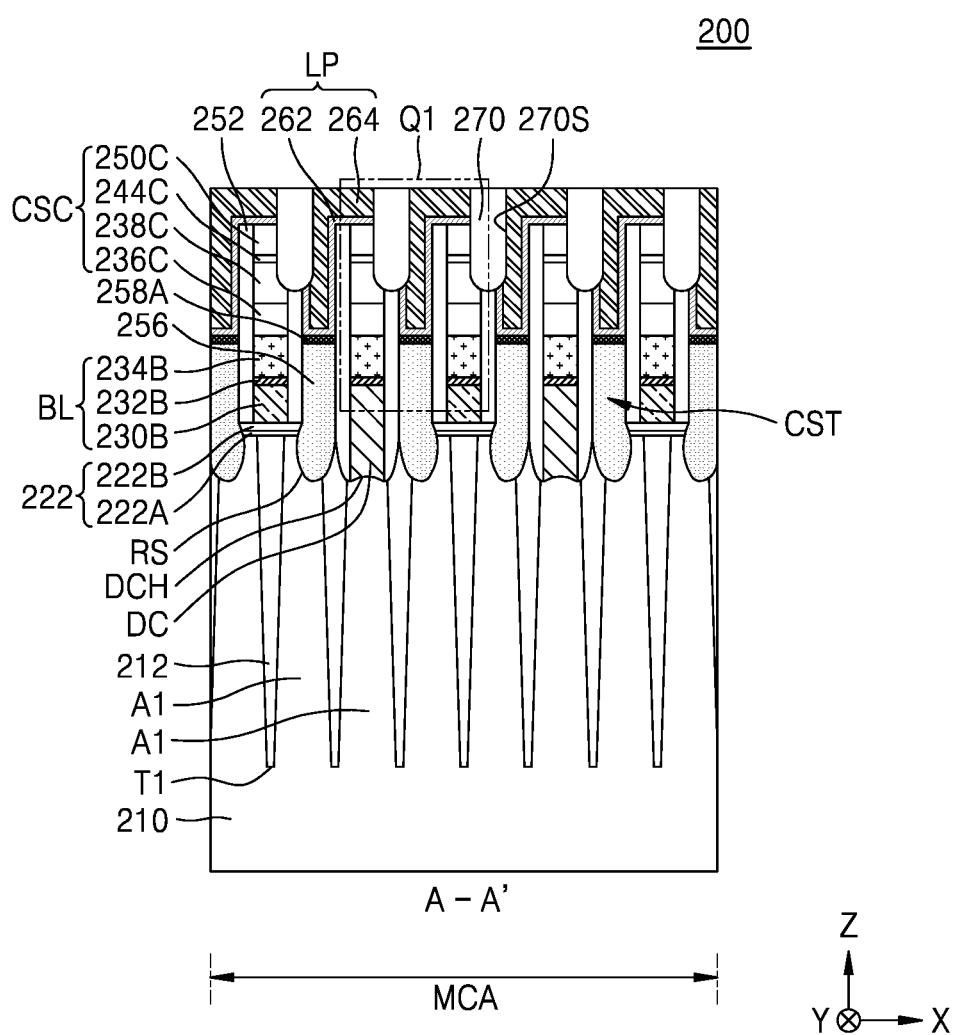
FIGS. 4A and 4B are cross-sectional views, taken along line A-A' and B-B' of FIG. 3, of an integrated circuit device according to an embodiment of the inventive concept.
Figure 4B:
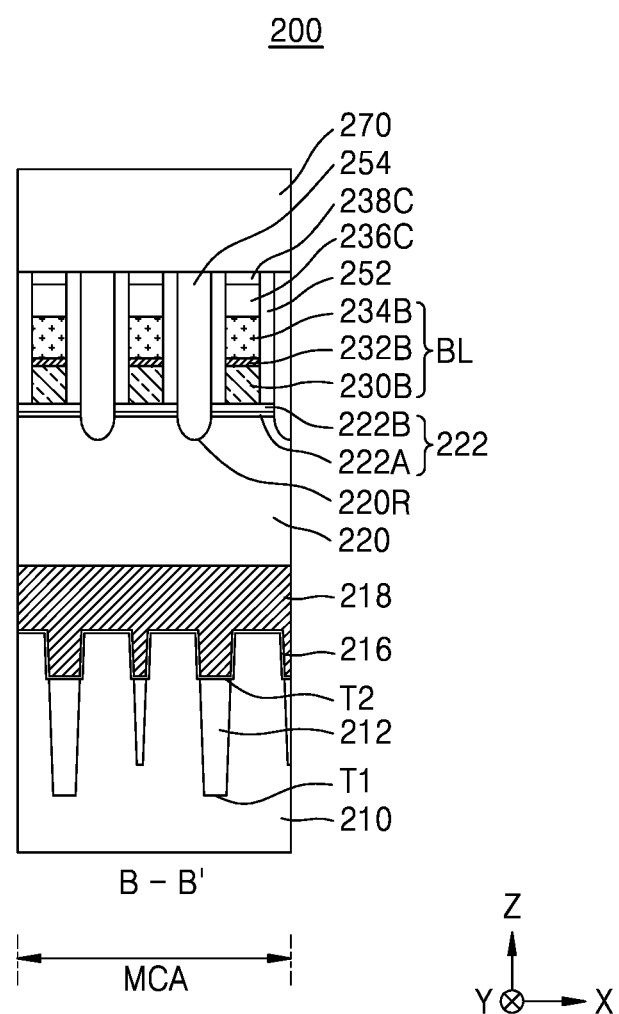
Figure 4C:
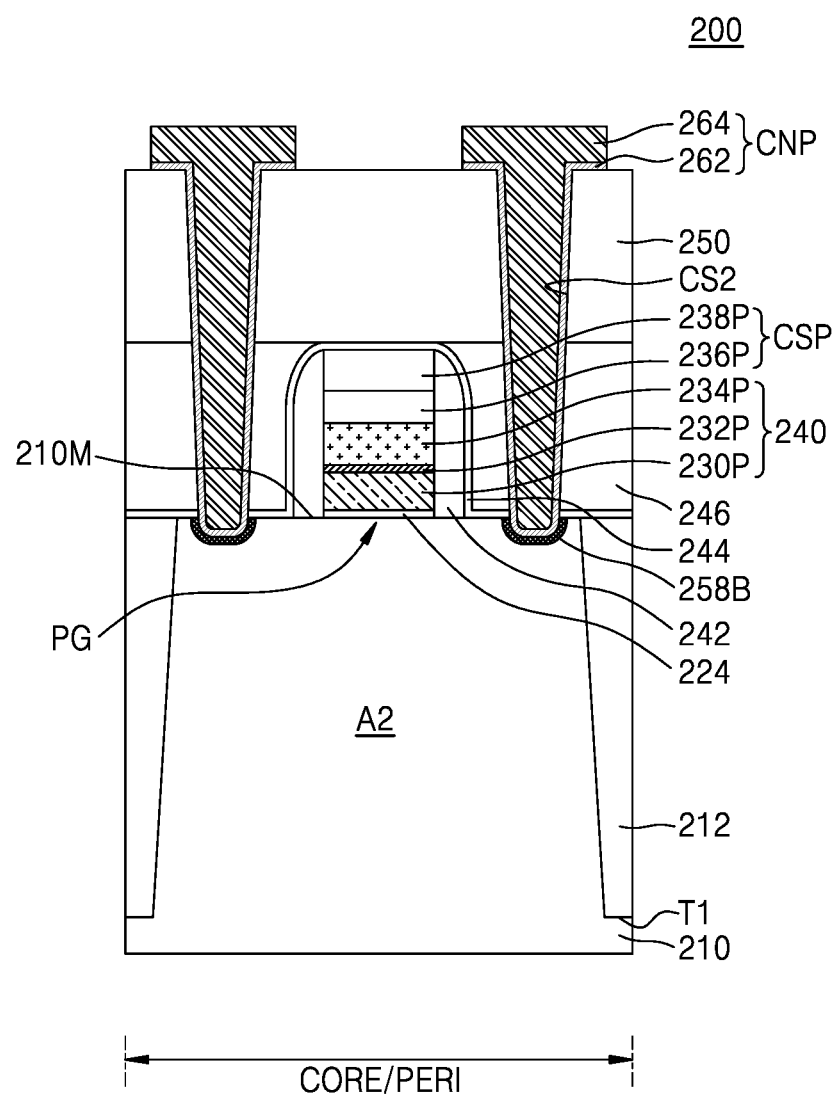
FIG. 4C is a cross-section view of a peripheral circuit area CORE/PERI of an integrated circuit device of FIG. 2 according to an embodiment of the inventive concept.

FIGS. 4A to 4C are cross-sectional views illustrating an integrated circuit device 200 according to one or more embodiments. FIGS. 4A and 4B are cross-sectional views showing an exemplary structure of a part of the cell array area MCA in the integrated circuit device 200, and FIG. 4C is a cross-sectional view showing an exemplary structure of a part of the peripheral circuit area CORE/PERI in the integrated circuit device 200. The cell array area MCA of the integrated circuit device 200 may have a layout as shown in FIG. 3. FIG. 4A shows a cross-section taken along line A-A' of FIG. 3, and FIG. 4B shows a cross-section taken along line B-B' of FIG. 3.

Figure 5:
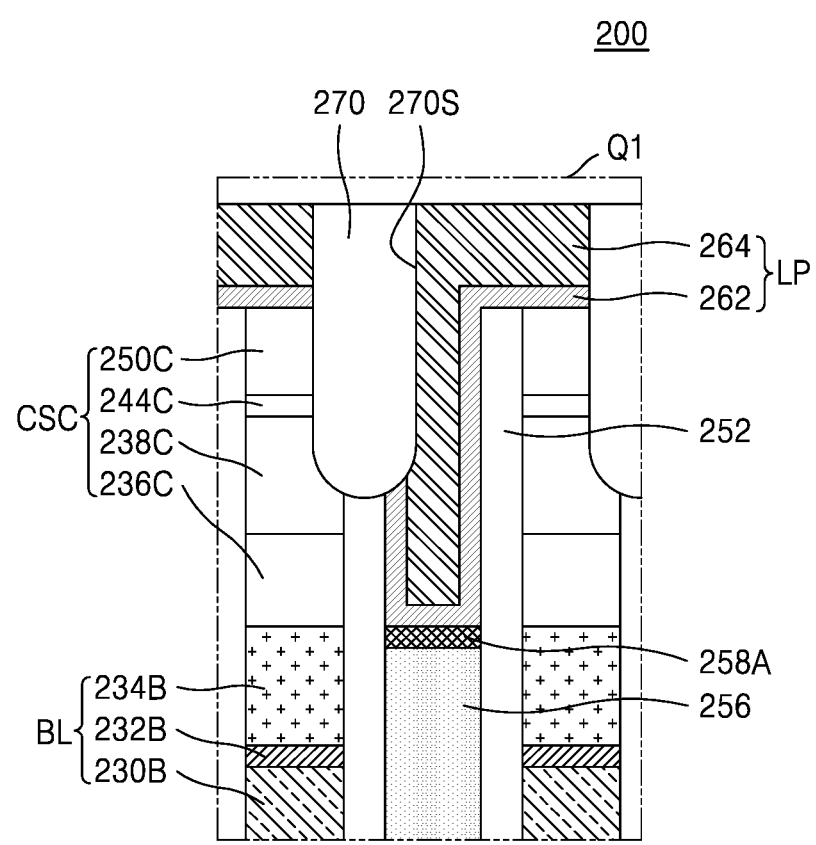
FIG. 5 is an enlarged cross-sectional view of dashed-line region "Q1" in FIG. 4A.

FIG. 5 is an enlarged cross-sectional view of a dashed-line region "Q1" in FIG. 4A.

Referring to FIGS. 4A to 4C and FIG. 5, the integrated circuit device 200 may be a part of the integrated circuit device 100 shown in FIGS. 1 to 3. The integrated circuit device 200 includes a substrate 210 having the cell array area MCA and the peripheral circuit area CORE/PERI. An isolation trench T1 is formed in the substrate 210, and an isolation layer 212 is formed in the isolation trench T1. Each of the plurality of cell active areas A1 is defined in the substrate 210 in the cell array area MCA of the substrate 210 by the isolation layer 212. A peripheral active area A2 may be defined in the substrate 210 in the peripheral circuit area CORE/PERI by the isolation layer 212.

The substrate 210 may include silicon, e.g., single-crystalline silicon, polycrystalline silicon, or amorphous silicon. In some embodiments, the substrate 210 may include at least one selected from Ge, SiGe, SiC, GaAs, InAs, and InP. In some embodiments, the substrate 210 may include a conductive region (for example, a well region) doped with impurities or a structure doped with impurities. The isolation layer 212 may include an oxide layer, a nitride layer, or a combination thereof.

In the cell array area MCA, a plurality of word line trenches T2 extending in the first horizontal direction (X-direction) are formed in the substrate 210, and in the plurality of word line trenches T2, a plurality of gate dielectric layers 216, a plurality of gate lines 218, and a plurality of buried insulating layers 220 are formed. The plurality of gate lines 218 may correspond to the plurality of word lines WL shown in FIG. 3. A plurality of recessed spaces 220R may be formed in upper surfaces of the buried insulating layers 220. The plurality of gate dielectric layers 216 may each include a silicon oxide layer, a silicon nitride layer, a silicon oxynitride layer, an oxide/nitride/oxide (ONO) layer, or a high-k dielectric layer having a dielectric constant that is greater than that of the silicon oxide layer. For example, the plurality of gate dielectric layers 216 may each include $HfO_2$, $Al_2O_3$, $HfAlO_3$, $Ta_2O_3$, or $TiO_2$. The plurality of gate lines 218 may each include Ti, TiN, Ta, TaN, W, WN, TiSiN, WSiN, or a combination thereof. The plurality of buried insulating layers 220 may each include a silicon oxide layer, a silicon nitride layer, a silicon oxynitride layer, or a combination thereof.

In the cell array area MCA, a buffer layer 222 may be formed on the substrate 210. The buffer layer 222 may include a first insulating layer 222A and a second insulating layer 222B. Each of the first insulating layer 222A and the second insulating layer 222B may include an oxide layer, a nitride layer, or a combination thereof. A plurality of direct contacts DC may be arranged on the plurality of cell active areas A1. Each of the direct contacts DC may include Si, Ge, W, WN, Co, Ni, Al, Mo, Ru, Ti, TiN, Ta, TaN, Cu, or a combination thereof.

A plurality of bit lines BL may extend in the second horizontal direction (Y-direction) on the substrate 210 and the plurality of direct contacts DC. Each of the plurality of bit lines BL may be connected to the cell active area A1 via a corresponding one of the direct contacts DC. Each of the plurality of bit lines BL may include a lower conductive pattern 230B, an intermediate conductive pattern 232B, and an upper conductive pattern 234B that are sequentially stacked on the substrate 210. The upper conductive pattern 234B, that is, the uppermost layer of the bit line BL, may include metal. The lower conductive pattern 230B may include doped polysilicon. The intermediate conductive pattern 232B may include TiN, TiSiN, W, tungsten silicide, or a combination thereof. In one or more embodiments, the intermediate conductive pattern 232B may include TiN, TiSiN, or a combination thereof, and the upper conductive pattern 234B may include W.

In an example embodiment, the plurality of insulation capping structures CSC may be vertically stacked on the plurality of bit lines BL, respectively. The plurality of bit lines BL may be covered by a plurality of insulation capping structures CSC, respectively. For example, each of the plurality of insulating capping structures CSC may cover an upper surface of a corresponding one of the plurality of bit lines BL. The plurality of bit lines BL and the plurality of insulation capping structures CSC may extend in parallel with one another in the second horizontal direction (Y-direction).

Each of the insulation capping structures CSC may include a first insulation capping pattern 236C, a second insulation capping pattern 238C, an insulation thin film pattern 244C, and a third insulation capping pattern 250C that are sequentially stacked on the upper conductive pattern 234B of the bit line BL. In the plurality of insulation capping structures CSC, a bottom surface of the first insulation capping pattern 236C may be in contact with an upper surface of the upper conductive pattern 234B. A bottom surface of the second insulation capping pattern 238C may be in contact with an upper surface of the first insulation capping pattern 236C. The term "contact" or the phrase of "in contact with" as used herein, refer to a direction connection (i.e., touching) unless the context indicates otherwise.

In each of the plurality of insulation capping structures CSC, the first insulation capping pattern 236C and the second insulation capping pattern 238C may have different densities from each other. In one or more embodiments, of the first insulation capping pattern 236C and the second insulation capping pattern 238C, the first insulation capping pattern 236C closer to the upper conductive pattern 234B of the bit line BL may have a first density and the second insulation capping pattern 238C apart from the upper conductive pattern 234B of the bit line BL with the first insulation capping pattern 236C therebetween may have a second density that is greater than the first density. The insulation thin film pattern 244C and the third insulation capping pattern 250C may have the second density, similar to that of the second insulation capping pattern 238C. In the first horizontal direction (X-direction), the first insulation capping pattern 236C, the second insulation capping pattern 238C, the insulation thin film pattern 244C, and the third insulation capping pattern 250C may have substantially the same widths. The term "substantially" may be used herein to emphasize this meaning, unless the context or other statements indicate otherwise. For example, items described as "substantially the same," or "substantially equal," may be exactly the same, or equal, or may be the same, or equal within acceptable variations that may occur, for example, due to manufacturing processes.

In one or more embodiments, the first insulation capping pattern 236C and the second insulation capping pattern 238C may include the same material as each other. In other embodiments, the first insulation capping pattern 236C and the second insulation capping pattern 238C may include different materials from each other. The first insulation capping pattern 236C may include a silicon nitride layer, a silicon carbonitride layer, or a combination thereof. The second insulation capping pattern 238C, the insulation thin film pattern 244C, and the third insulation capping pattern 250C may each include a silicon nitride layer. A thickness of the first insulation capping pattern 236C in a vertical direction (Z-direction) may be less than that of the second insulation capping pattern 238C in the vertical direction (Z-direction). For example, the first insulation capping pattern 236C may have a thickness of about 20 Å to about 400 Å, and a thickness of the second insulation capping pattern 238C may be greater than that of the first insulation capping pattern 236C. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In one or more embodiments, the upper conductive pattern 234B may include, in an upper region thereof, a nitrogen atom diffusion area (i.e., a region doped with nitrogen atoms). The nitrogen atom diffusion area may range from an interface between the upper conductive pattern 234B and the first insulation capping pattern 236C to a partial thickness of the upper conductive pattern 234B towards the substrate 210 in the upper conductive pattern 234B. The thickness (length in the Z-direction) of the nitrogen atom diffusion area may be about 0.01% to about 10% of a total thickness (length in the Z-direction) of the upper conductive pattern 234B. For example, the nitrogen atom diffusion area may extend to a thickness of about 5 Å to about 40 Å from the interface between the upper conductive pattern 234B and the first insulation capping pattern 236C or from a thickness of about 5 Å to about 40 Å in the upper conductive pattern 234B, but the thickness of the nitrogen atom diffusion area is not limited thereto.

In the nitrogen atom diffusion area, nitrogen (N) atoms may be in a diffused state without chemically bonding with other atoms included in the upper conductive pattern 234B. In one or more embodiments, when the upper conductive pattern 234B includes a tungsten (W) layer and the first insulation capping pattern 236C includes a silicon nitride layer, the nitrogen atom diffusion area in the upper conductive pattern 234B may include the tungsten (W) layer formed of tungsten (W) atoms, nitrogen (N) atoms distributed among tungsten crystal structures (i.e., among the tungsten (W) atoms) included in the W layer without chemically bonding with the tungsten (W) atoms of the tungsten crystal structures of the W layer, and tungsten nitride particles diffused in the W layer. The tungsten nitride particles may include a chemical bond between W and N. In an example embodiment, the nitrogen atom diffusion area may be an upper portion of the W layer, the upper portion of the W layer being doped with nitrogen N atoms and including the tungsten nitride particles distributed within the upper portion of the W layer. The thickness of the first region may be about 0.01% to about 10% of a total thickness of the W layer.

Side walls of the plurality of bit lines BL and side walls of the insulation capping structures CSC may be covered by a plurality of insulation spacers 252. The plurality of insulation spacers 252 may extend in parallel with the plurality of bit lines BL in the second horizontal direction (Y-direction). The plurality of insulation spacers 252 may each include an oxide layer, a nitride layer, an air spacer, or a combination thereof. In the specification, the term "air" may denote atmosphere or a space including other gases that may exist during manufacturing processes.

A plurality of insulating fences 254 and a plurality of conductive plugs 256 may be arranged in a row between the plurality of bit lines BL and between the plurality of insulation capping structures CSC in the second horizontal direction (Y-direction). The plurality of insulating fences 254 fill the plurality of recessed spaces 220R formed in the upper surface of the buried insulating layer 220, and each of the insulating fences 254 may be arranged between two conductive plugs 256 spaced apart from each other in the second horizontal direction (Y-direction). Opposite side walls of each of the plurality of conductive plugs 256 in the second horizontal direction (Y-direction) may be covered by the plurality of insulating fences 254. The plurality of conductive plugs 256 arranged in a row in the second horizontal direction (Y-direction) may be insulated from one another by the plurality of insulating fences 254. The plurality of insulating fences 254 may each include a silicon nitride layer. The plurality of conductive plugs 256 may configure the plurality of buried contacts BC shown in FIG. 3. One direct contact DC and a pair of conductive plugs 256 facing each other with the direct contact DC therebetween may be connected to different cell active areas A1 from one another, from among the plurality of cell active areas A1.

A plurality of metal silicide layers 258A and the plurality of conductive landing pads LP may be formed on the plurality of conductive plugs 256. The metal silicide layer 258A and the conductive landing pad LP may be arranged to overlap the conductive plug 256 in the vertical direction. Each of the plurality of conductive landing pads LP may be connected to the conductive plug 256 via the metal silicide layer 258A. The plurality of conductive landing pads LP may at least partially cover an upper surface of the third insulation capping pattern 250C so as to vertically overlap some of the plurality of bit lines BL. The conductive plug 256, the metal silicide layer 258A, and the conductive landing pad LP may configure a contact structure CST that connects a capacitor lower electrode (not shown) formed on the conductive landing pad LP to the cell active area A1.

The metal silicide layer 258A may include cobalt silicide, nickel silicide, or manganese silicide. Each of the plurality of conductive landing pads LP may include a conductive barrier layer 262 and a main conductive layer 264. The conductive barrier layer 262 may include Ti, TiN, or a combination thereof. The main conductive layer 264 may include metal, metal nitride, conductive polysilicon, or a combination thereof. For example, the main conductive layer 264 may include W. The plurality of conductive landing pads LP may have an island-type pattern shape on a plane. The plurality of conductive landing pads LP may be electrically insulated from one another by an insulating layer 270 that fills an insulation space 270S around each of the plurality of conductive landing pads LP. The insulating layer 270 may include a silicon nitride layer, a silicon oxide layer, or a combination thereof.

In the peripheral circuit area CORE/PERI, a gate structure PG may be formed on the substrate 210. The gate structure PG may include a gate dielectric layer 224, a gate electrode 240, and an insulation capping structure CSP that are sequentially stacked on the peripheral active area A2.

The gate dielectric layer 224 may include at least one selected from a silicon oxide layer, a silicon nitride layer, a silicon oxynitride layer, oxide/nitride/oxide (ONO), and a high-k dielectric layer having a dielectric constant that is greater than that of the silicon oxide layer. The gate electrode 240 may include a lower conductive pattern 230P, an intermediate conductive pattern 232P, and an upper conductive pattern 234P. The lower conductive pattern 230P, the intermediate conductive pattern 232P, and the upper conductive pattern 234P may respectively include the same materials as those of the lower conductive pattern 230B, the intermediate conductive pattern 232B, and the upper conductive pattern 234B included in the bit line BL in the cell array area MCA.

The insulation capping structure CSP may include a first insulation capping pattern 236P and a second insulation capping pattern 238P. In the insulation capping structure CSP, a bottom surface of the first insulation capping pattern 236P may be in contact with an upper surface of the upper conductive pattern 234P of the gate electrode 240. A bottom surface of the second insulation capping pattern 238P may be in contact with an upper surface of the first insulation capping pattern 236P. In the insulation capping structure CSP, the first insulation capping pattern 236P and the second insulation capping pattern 238P may have different densities from each other. In one or more embodiments, of the first insulation capping pattern 236P and the second insulation capping pattern 238P, the first insulation capping pattern 236P that is closer to the upper conductive pattern 234P of the gate electrode 240 may have a first density like the first insulation capping pattern 236C in the cell array area MCA. The second insulation capping pattern 238P apart from the upper conductive pattern 234P of the gate electrode 240 with the first insulation capping pattern 236P therebetween may have a second density that is greater than the first density, like the second insulation capping pattern 238C in the cell array area MCA. In a horizontal direction that is in parallel with a main surface 210M of the substrate 210, a width of the first insulation capping pattern 236P is substantially the same as that of the second insulation capping pattern 238P.

In one or more embodiments, the first insulation capping pattern 236P and the second insulation capping pattern 238P may include the same material as each other. In another embodiment, the first insulation capping pattern 236P and the second insulation capping pattern 238P may have different materials from each other. The first insulation capping pattern 236P may include a silicon nitride layer, a silicon carbonitride layer, or a combination thereof. The second insulation capping pattern 238P may include a silicon nitride layer.

In one or more embodiments, the upper conductive pattern 234P of the gate electrode 240 may include a nitrogen atom diffusion area in a part of an upper region therein. The nitrogen atom diffusion area may extend from an interface between the upper conductive pattern 234P and the first insulation capping pattern 236P of the gate electrode 240 to a point in the thickness of the upper conductive pattern 234P towards the substrate 210 in the upper conductive pattern 234P. A thickness (length in the Z-direction) of the nitrogen atom diffusion area may be about 0.01% to about 10% of a total thickness (length in the Z-direction) of the upper conductive pattern 234P. For example, the nitrogen atom diffusion area may extend to a thickness of about 5 Å to about 40 Å from the interface between the upper conductive pattern 234P and the first insulation capping pattern 236P or from a thickness of about 5 Å to about 40 Å in the upper conductive pattern 234P, but the thickness of the nitrogen atom diffusion area is not limited thereto.

In the nitrogen atom diffusion area, N atoms may be in a diffused state without chemically bonding with other atoms included in the upper conductive pattern 234P. In one or more embodiments, when the upper conductive pattern 234P includes a W layer and the first insulation capping pattern 236P includes a silicon nitride layer, the nitrogen atom diffusion area in the upper conductive pattern 234P may include the W layer formed of W atoms, N atoms distributed among tungsten crystal structures (i.e., among the W atoms) included in the W layer without chemically bonding with the W atoms of the tungsten crystal structures of the W layer, and tungsten nitride particles diffused in the W layer. The tungsten nitride particles may include a chemical bond between W and N.

Opposite side walls of the gate structure PG may be covered by the insulation spacer 242. The insulation spacer 242 may include an oxide layer, a nitride layer, or a combination thereof. The gate structure PG and the insulation spacer 242 may be covered by an insulation thin film 244. The insulation thin film 244 may include a silicon nitride layer. An interlayer insulating layer 246 filling a space around the gate structure PG may be formed on the insulation thin film 244. The interlayer insulating layer 246 may include tonen silazene (TOSZ), but is not limited thereto. The gate structure PG, the insulation thin film 244, and the interlayer insulating layer 246 may be covered by a third insulation capping layer 250. The third insulation capping layer 250 may include a silicon nitride layer.

In the peripheral circuit area CORE/PERI, a contact space CS2 passes through the third insulation capping layer 250, the interlayer insulating layer 246, and the insulation thin film 244 in a vertical direction and then extends into the peripheral active area A2 of the substrate 210. A plurality of conductive patterns CNP may be formed on the third insulation capping layer 250. The plurality of conductive patterns CNP may extend in various planar shapes on the third insulation capping layer 250. The plurality of conductive patterns CNP may each serve as a contact plug that extends in the vertical direction by passing through the third insulation capping layer 250, the interlayer insulating layer 246, and the insulation thin film 244 via the contact space CS2. The plurality of conductive patterns CNP may each include a conductive barrier layer 262 and a main conductive layer 264, like in the plurality of conductive landing pads LP formed in the cell array area MCA. A metal silicide layer 258B may be between the peripheral active area A2 and each of the plurality of conductive patterns CNP. The metal silicide layer 258B may include cobalt silicide, nickel silicide, or manganese silicide.

Figure 6A:
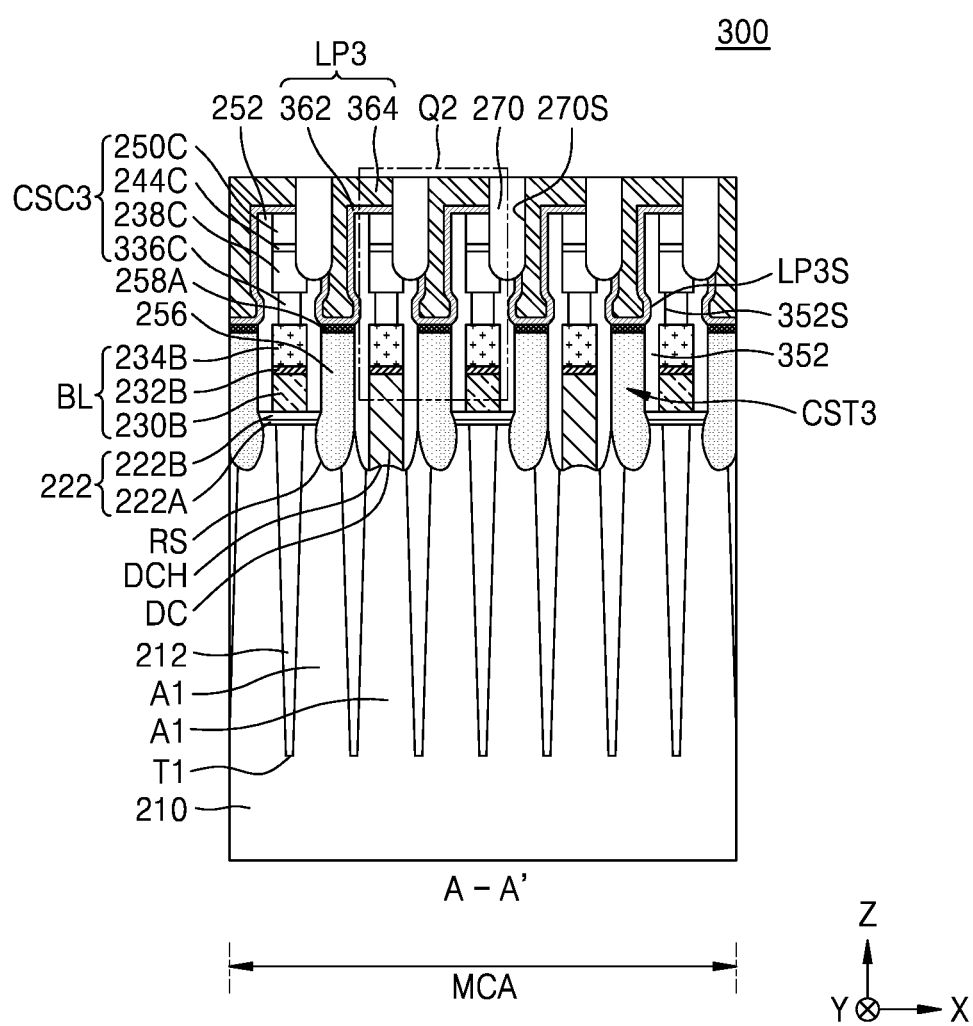
FIGS. 6A to 6C are cross-sectional views of integrated circuit devices according to embodiments of the inventive concept.
Figure 6B:
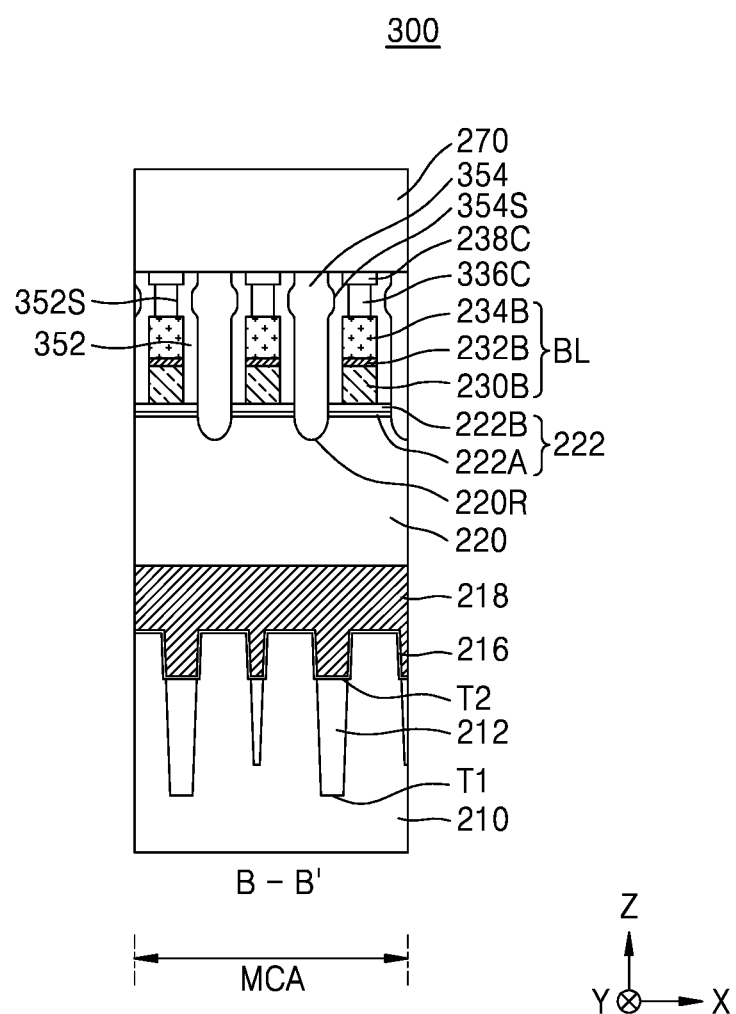
Figure 6C:
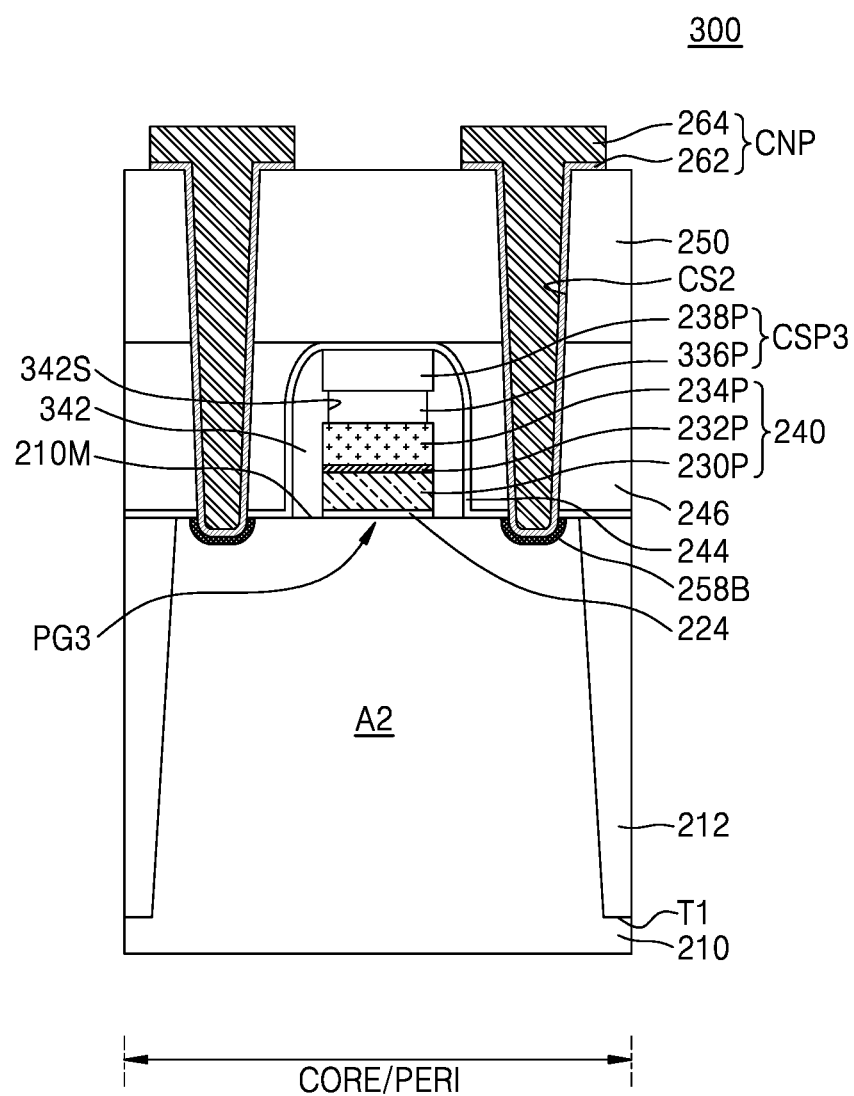

FIGS. 6A to 6C are cross-sectional views illustrating an integrated circuit device 300 according to one or more embodiments. FIGS. 6A and 6B are cross-sectional views showing an exemplary structure of a part of the cell array area MCA in the integrated circuit device 300, and FIG. 6C is a cross-sectional view showing an exemplary structure of a part of a peripheral circuit area CORE/PERI in the integrated circuit device 300. The cell array area MCA of the integrated circuit device 300 may have a layout as shown in FIG. 3. FIG. 6A shows a cross-section taken along line A-A' of FIG. 3, and FIG. 6B shows a cross-section taken along line B-B' of FIG. 3.

Figure 7:
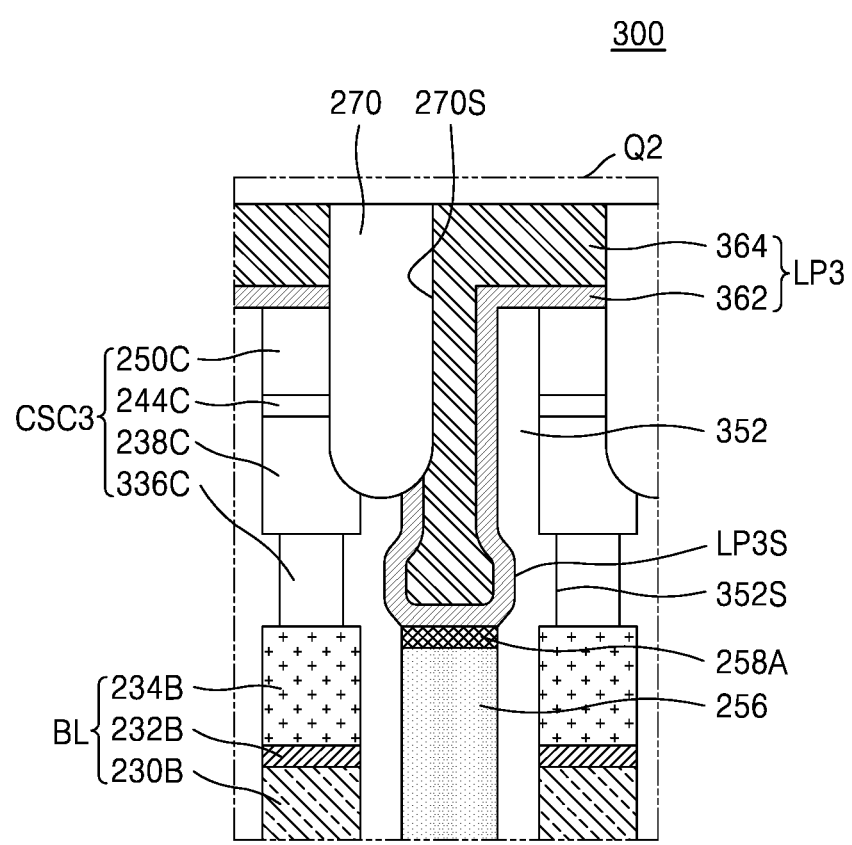
FIG. 7 is an enlarged cross-sectional view of dashed-line region "Q2" in FIG. 6A.

FIG. 7 is an enlarged cross-sectional view showing some elements included in a dashed-line region "Q2" in FIG. 6A.

Referring to FIGS. 6A to 6C and FIG. 7, the integrated circuit device 300 has a similar structure to that of the integrated circuit device 200 illustrated above with reference to FIGS. 4A to 4C and FIG. 5. The integrated circuit device 300 may include a plurality of insulation capping structures CSC3 covering the plurality of bit lines BL. The insulation capping structures CSC3 may have a similar structure to that of the insulation capping structures CSC illustrated with reference to FIGS. 4A and 5. However, the insulation capping structure CSC3 includes a first insulation capping pattern 336C, instead of the first insulation capping pattern 236C of the insulation capping structure CSC of FIG. 4A.

A bottom surface of the first insulation capping pattern 336C may be in contact with the upper surface of the upper conductive pattern 234B. A bottom surface of the second insulation capping pattern 238C may be in contact with an upper surface of the first insulation capping pattern 336C.

In each of the plurality of insulation capping structures CSC3, the first insulation capping pattern 336C and the second insulation capping pattern 238C may have different densities from each other. In one or more embodiments, the first insulation capping pattern 336C may have a first density and the second insulation capping pattern 238C may have a second density that is greater than the first density.

In the first horizontal direction (X-direction), the first insulation capping pattern 336C and the second insulation capping pattern 238C may have different minimum widths from each other. That is, in the first horizontal direction (X-direction), the minimum width of the first insulation capping pattern 336C is less than that of the second insulation capping pattern 238C. Due to the width difference between the first insulation capping pattern 336C and the second insulation capping pattern 238C in the first horizontal direction (X-direction), an undercut region may be formed under the second insulation capping pattern 238C near a point where a side wall of the first insulation capping pattern 336C and the bottom surface of the second insulation capping pattern 238C meet each other. A detailed structure of the first insulation capping pattern 336C is similar to the structure of the first insulation capping pattern 236C described with reference to FIGS. 4A, 4B, and 5.

Side walls of the plurality of bit lines BL and side walls of the insulation capping structures CSC3 may be covered by a plurality of insulation spacers 352. The plurality of insulation spacers 352 may each include a protruding side wall 352S protruding towards the first insulation capping pattern 336C. Detailed structures of the plurality of insulation spacers 352 are similar to those of the plurality of insulation spacers 252 described above with reference to FIGS. 4A, 4B, and 5.

The plurality of conductive plugs 256 and a plurality of insulating fences 354 may be arranged in a row in the second horizontal direction (Y-direction) between the plurality of bit lines BL and between the plurality of insulation capping structures CSC3. Each of the plurality of insulating fences 354 may include a protruding side wall 354S that protrudes towards the first insulation capping pattern 336C. Detailed structures of the plurality of insulating fences 354 are similar to those of the plurality of insulating fences 254 described above with reference to FIGS. 4A, 4B, and 5.

A plurality of metal silicide layers 258A and a plurality of conductive landing pads LP3 may be formed on the plurality of conductive plugs 256. The conductive landing pad LP3 may overlap the conductive plug 256 and the metal silicide layer 258A in the vertical direction. The conductive plug 256, the metal silicide layer 258A, and the conductive landing pad LP3 may configure a contact structure CST3 that connects a capacitor lower electrode (not shown) formed on the conductive landing pad LP3 to the cell active area A1. A part of the contact structure CST3 may include a protruding side wall that protrudes towards the first insulation capping pattern 336C. For example, as shown in FIG. 6A, the plurality of conductive landing pads LP3 may each include a protruding side wall LP3S that protrudes towards the first insulation capping pattern 336C. Each of the plurality of conductive landing pads LP3 may include a conductive barrier layer 362 and a main conductive layer 364. The conductive barrier layer 362 and the main conductive layer 364 may each include a protruding side wall that protrudes towards the first insulation capping pattern 336C at a portion corresponding to the protruding side wall LP3S. The conductive landing pad LP3 includes the protruding side walls LP3S at opposite sides in the first horizontal direction (X-direction), and thus the conductive landing pad LP3 may have a non-uniform width. For example, the conductive landing pad LP3 may have a first portion with a first width and a second portion with a second width. The first portion is between two adjacent first insulation capping patterns 336C, and the second portion is between two adjacent second insulation capping patterns 238C. The first and second widths are measured in the first horizontal direction (X-direction). The first width may be greater than the second width. Therefore, a volume of the conductive landing pad LP3 between two adjacent first insulation capping patterns 336C may be greater than that of the conductive landing pad LP3 that does not include the protruding side walls LP3S. As described above, since the conductive landing pad LP3 includes a portion having an increased volume due to the protruding side walls LP3S, resistance of the conductive landing pad LP3 may be reduced.

In FIG. 6A, the side walls of the conductive landing pad LP3 in the contact structure CST3 face the first insulation capping patterns 336C and accordingly, the protruding side walls LP3S are formed on the conductive landing pad LP3, but one or more embodiments are not limited thereto. For example, when an upper surface of the conductive plug 256 included in the contact structure CST3 has a higher level than that shown in FIG. 6A and the side walls of the conductive plug 256 face the first insulation capping patterns 336C, the conductive plug 256 may have protruding side walls that protrude towards the first insulation capping patterns 336C.

Detailed structures of the plurality of conductive landing pads LP3 are similar to those of the plurality of conductive landing pads LP described above with reference to FIGS. 4A, 4B, and 5. Detailed structures of the conductive barrier layer 362 and the main conductive layer 364 are similar to those of the conductive barrier layer 262 and the main conductive layer 264 described above with reference to FIGS. 4A, 4B, and 5.

In the peripheral circuit area CORE/PERI, a gate structure PG3 may be formed on the peripheral active area A2. The gate structure PG3 includes an insulation capping structure CSP3. The insulation capping structure CSP3 may have a similar structure to that of the insulation capping structure CSP shown in FIG. 4C. However, the insulation capping structure CSP3 includes a first insulation capping pattern 336P instead of the first insulation capping pattern 236P of FIG. 4C.

In a horizontal direction, a minimum width of the first insulation capping pattern 336P is less than a minimum width of the second insulation capping pattern 238P. Due to the width difference between the first insulation capping pattern 336P and the second insulation capping pattern 238P in the horizontal direction, an undercut region may be formed under the second insulation capping pattern 238P near a point where a side wall of the first insulation capping pattern 336P and the bottom surface of the second insulation capping pattern 238P meet each other. A detailed structure of the first insulation capping pattern 336P is similar to the structure of the first insulation capping pattern 236P described with reference to FIG. 4C.

Opposite side walls of the gate structure PG3 may be covered by the insulation spacer 342. The insulation spacer 342 may include a protruding side wall 342S that protrudes towards the first insulation capping pattern 336P. Detailed structure of the insulation spacer 342 is similar to that of the insulation spacer 242 described above with reference to FIG. 4C.

Figure 8A:
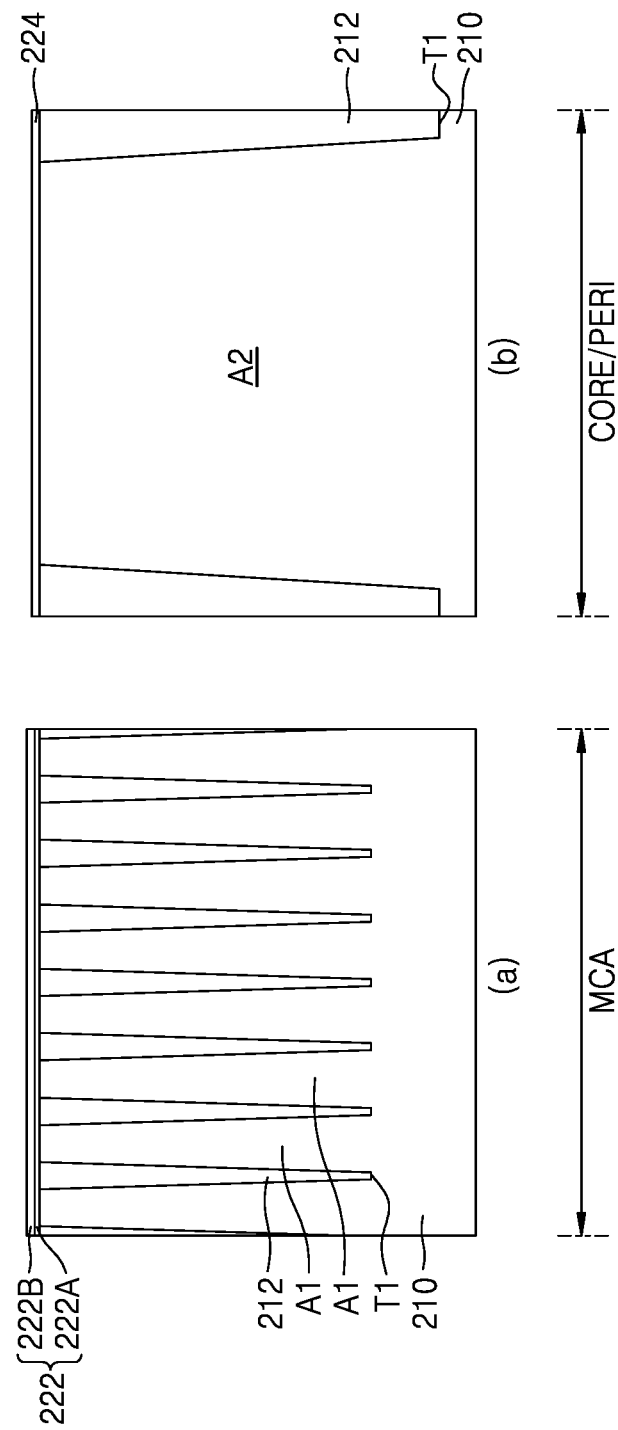
FIGS. 8A to 8Q are cross-sectional views for describing, in a processing order, a method of manufacturing an integrated circuit device according to one or more embodiments.
Figure 8B:
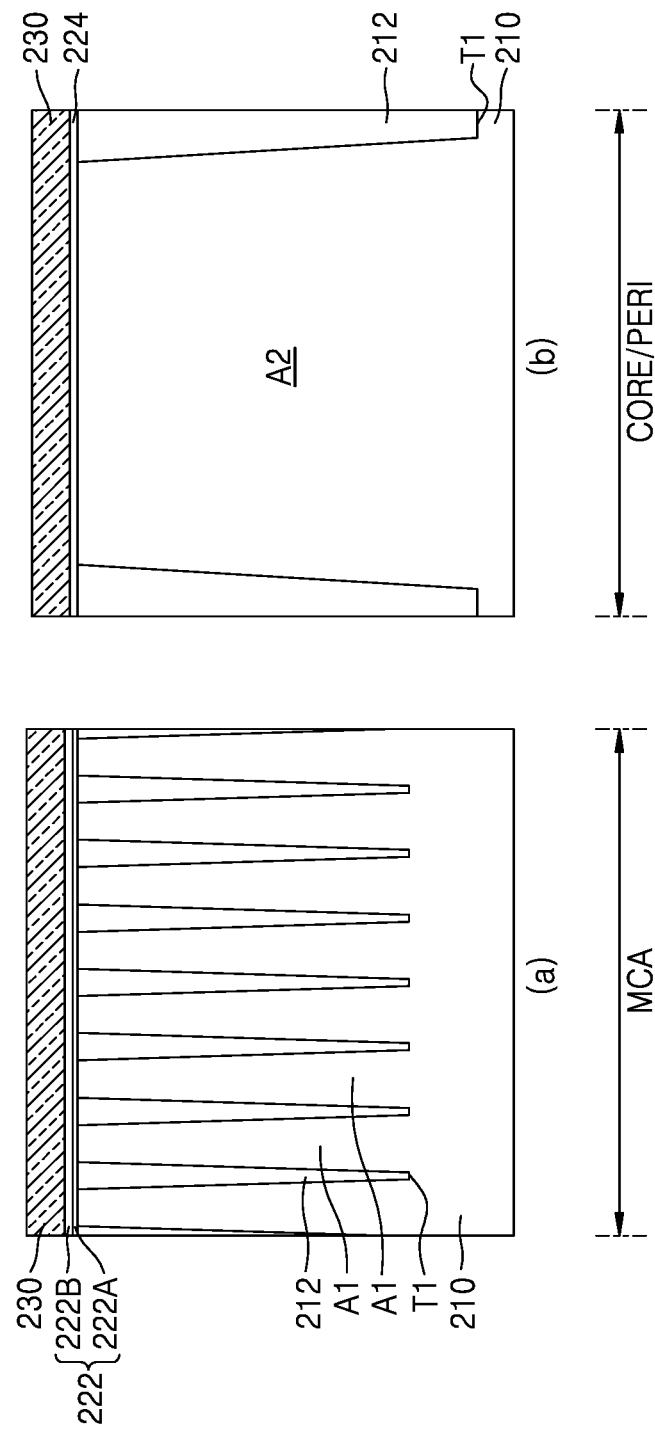
Figure 8C:
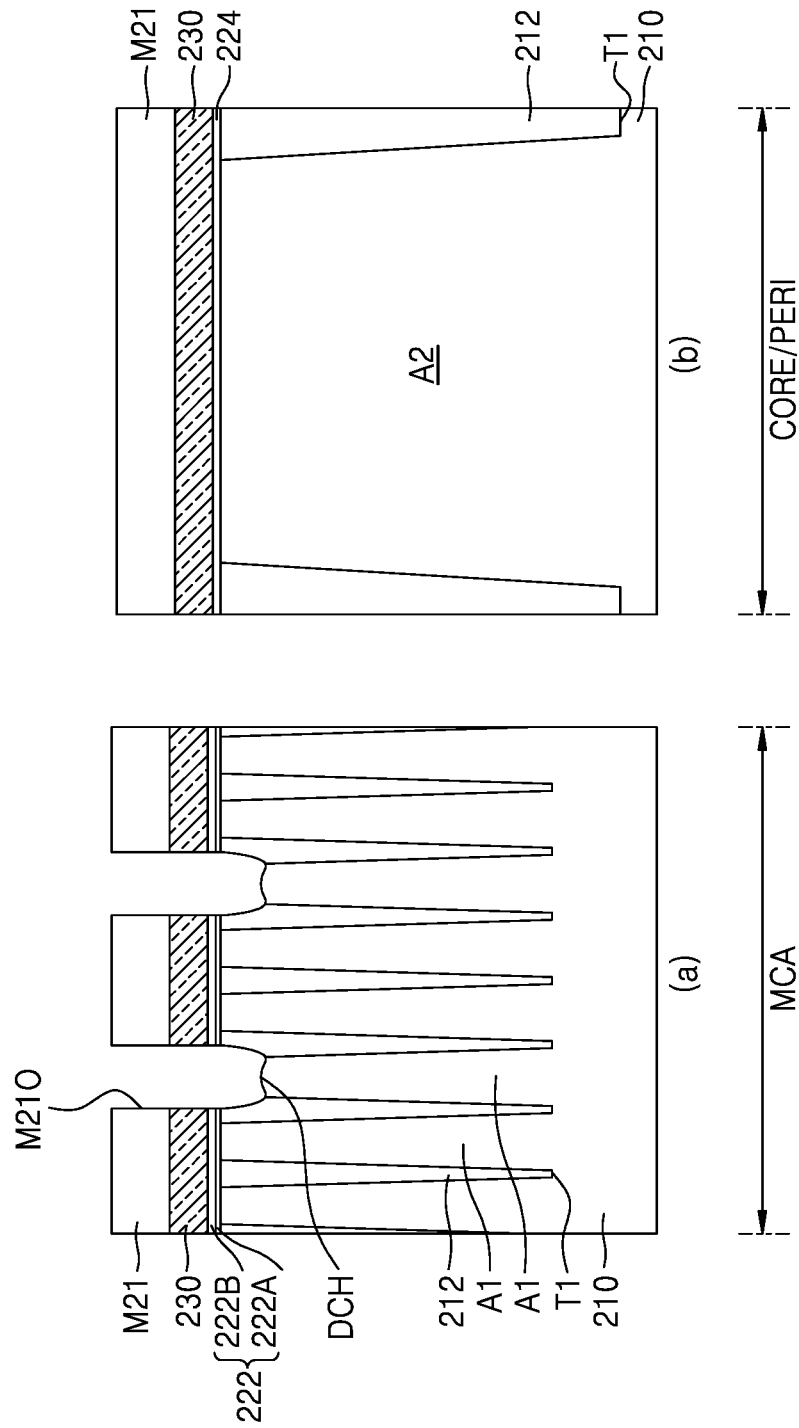
Figure 8D:
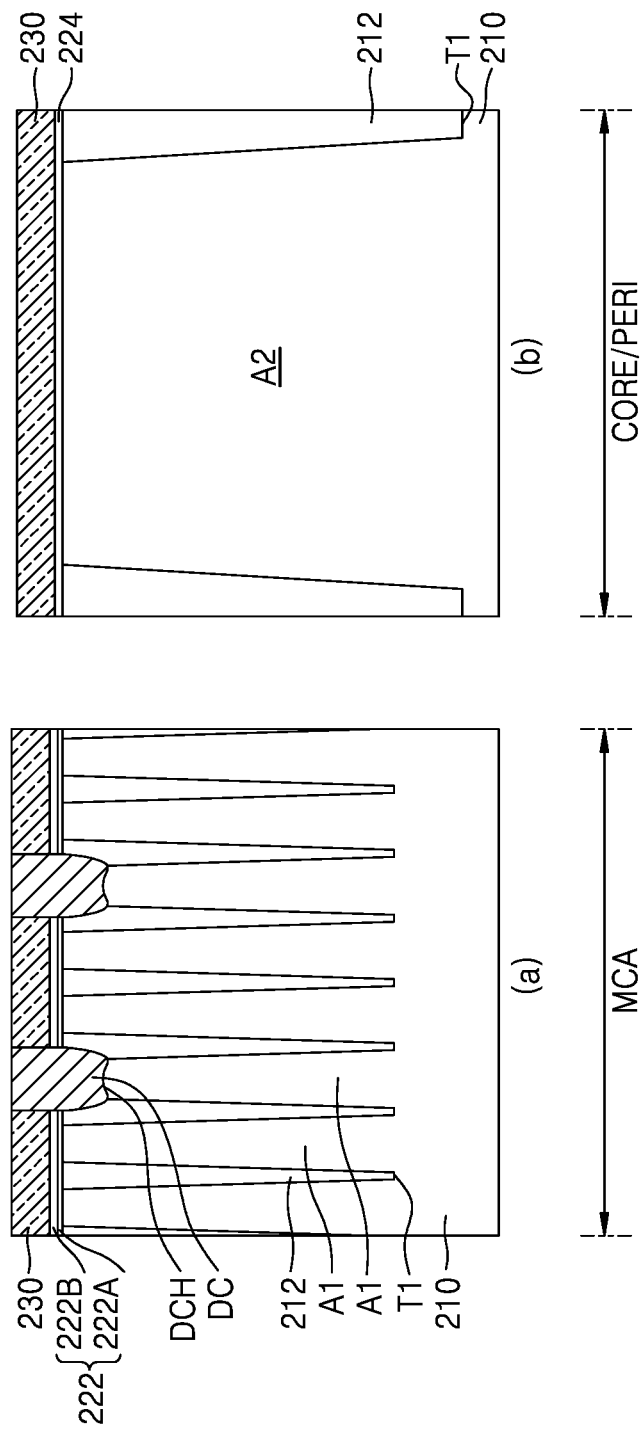
Figure 8E:
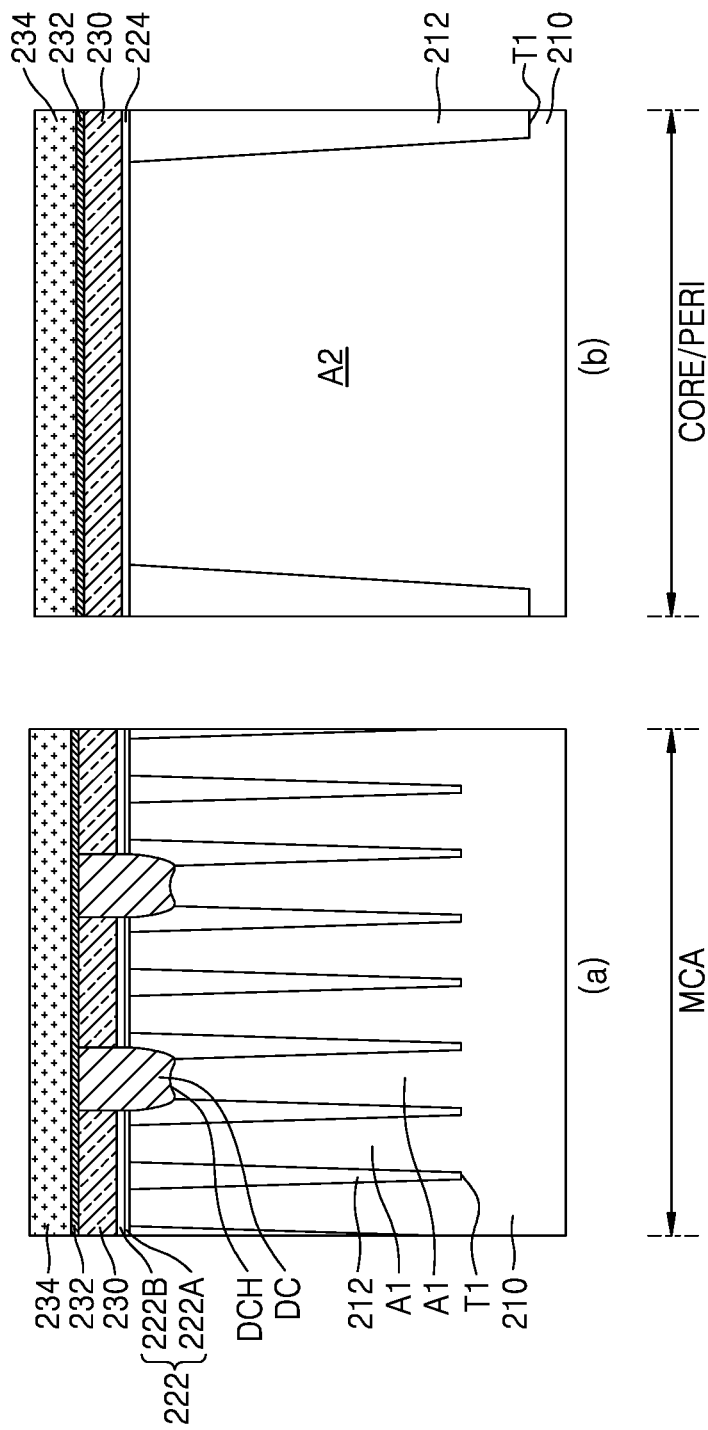
Figure 8F:
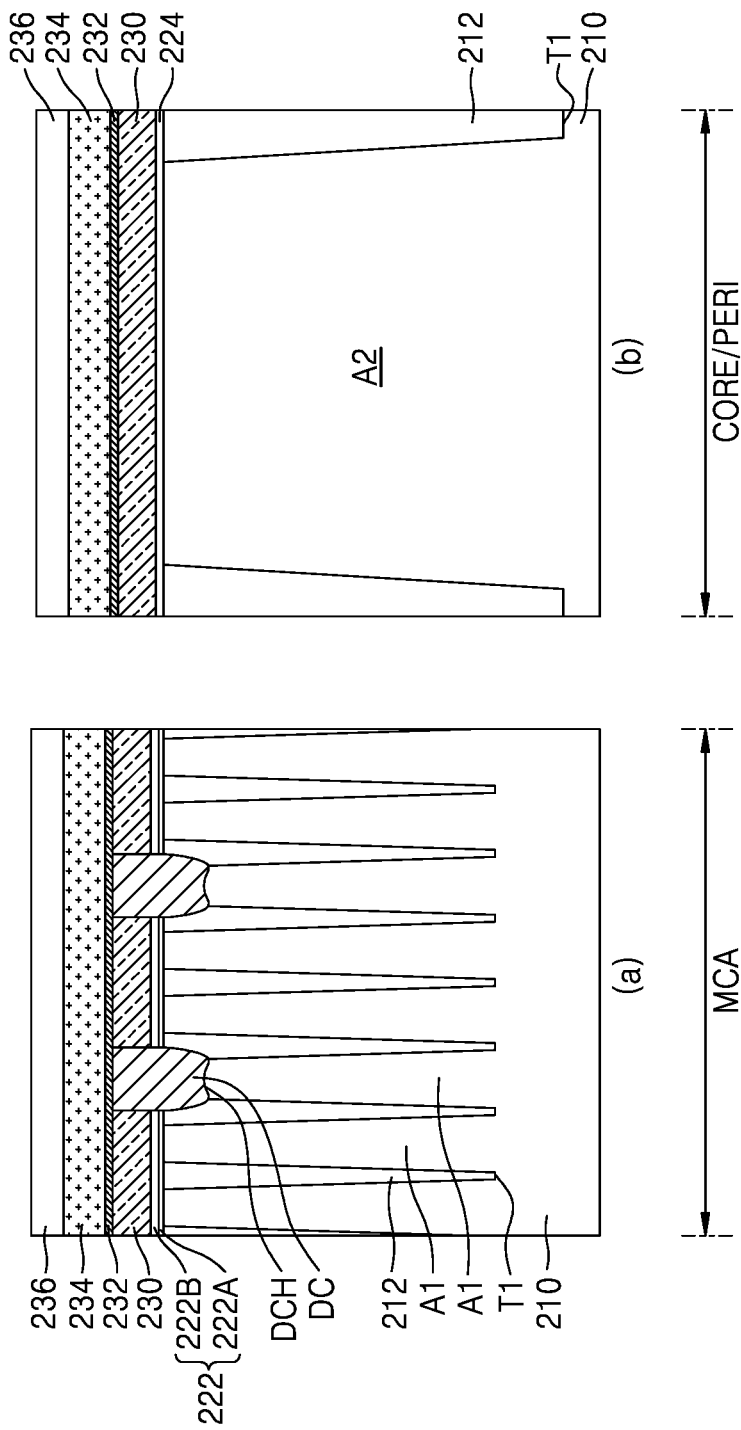
Figure 8G:
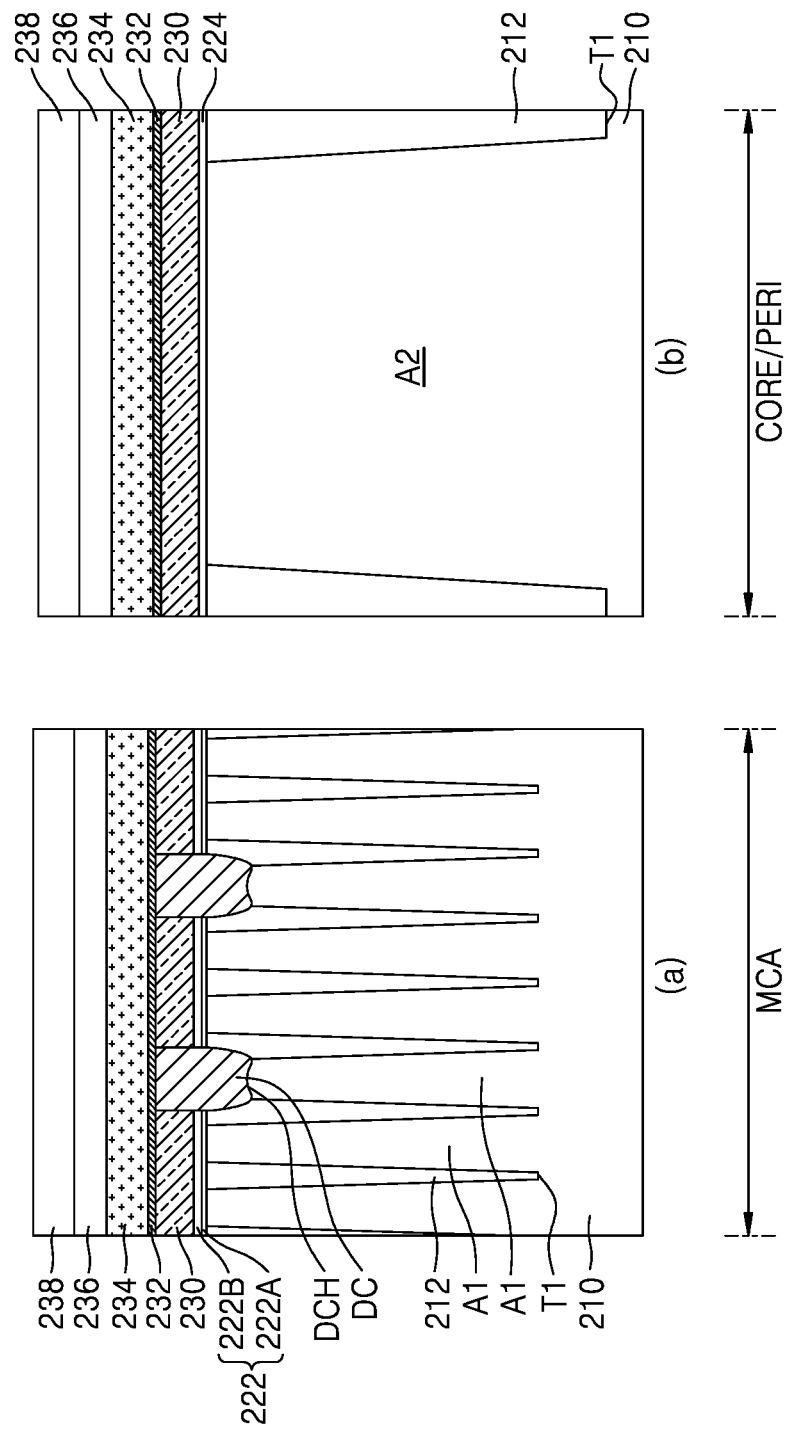
Figure 8H:
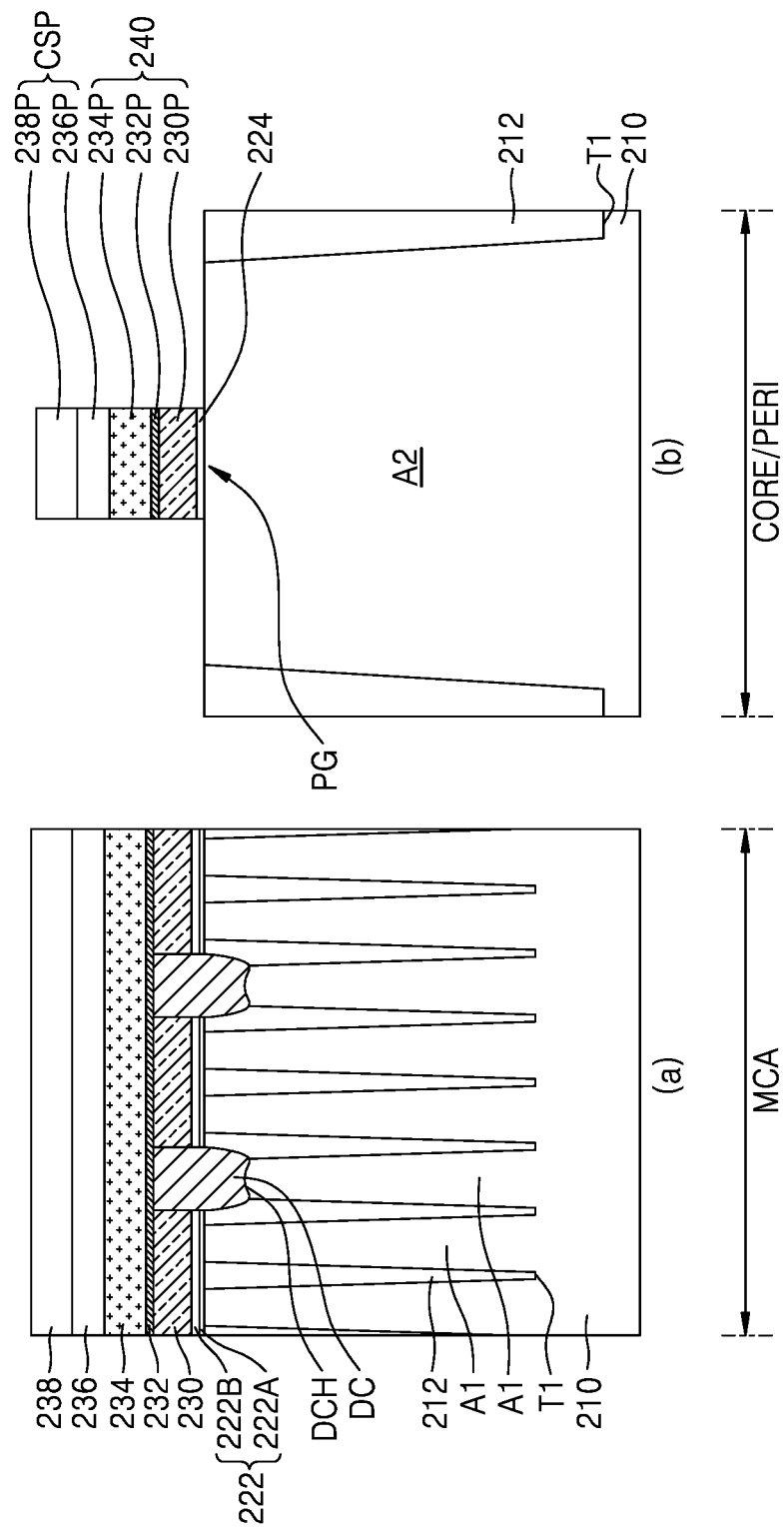
Figure 8I:
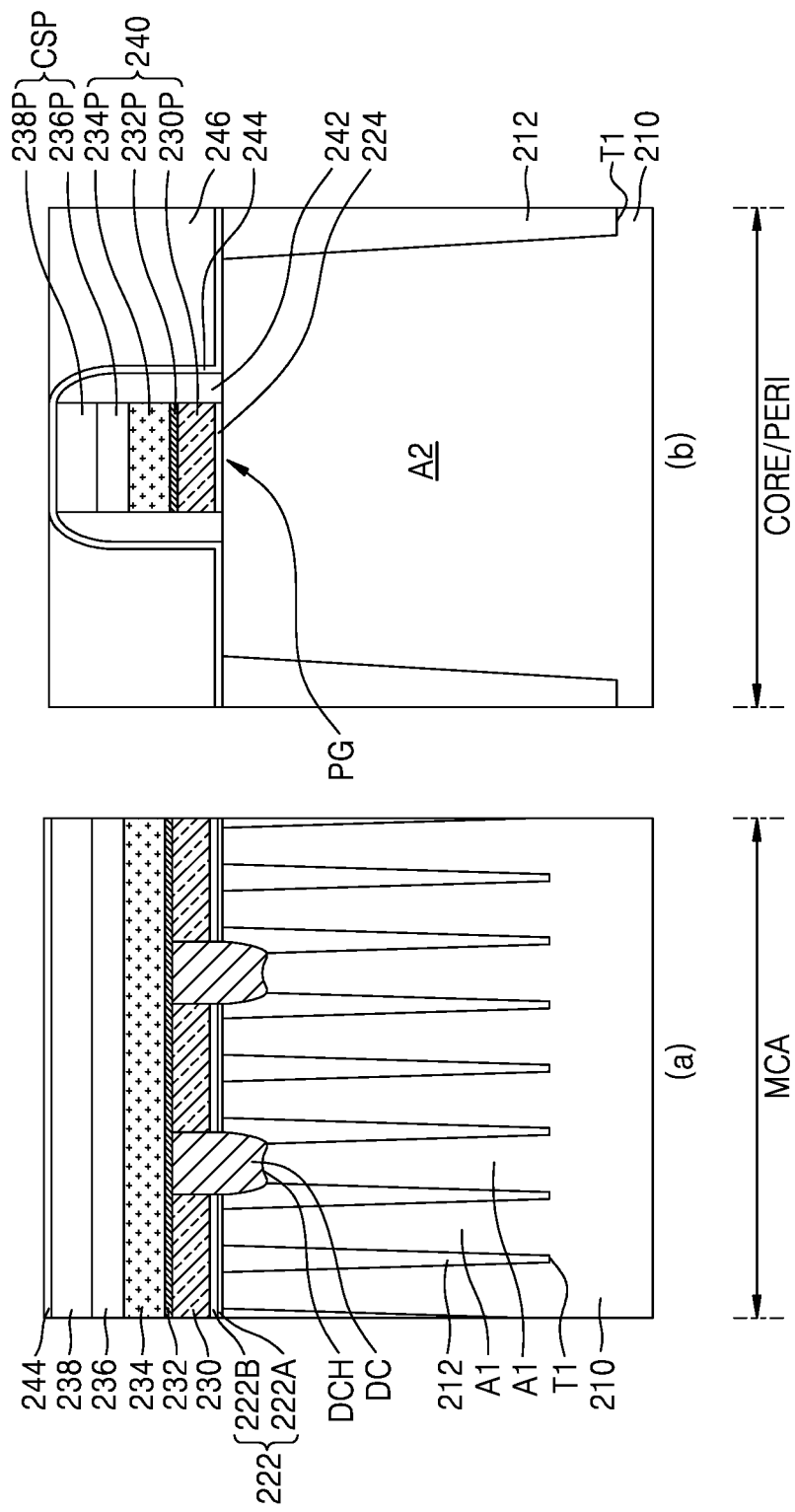
Figure 8J:
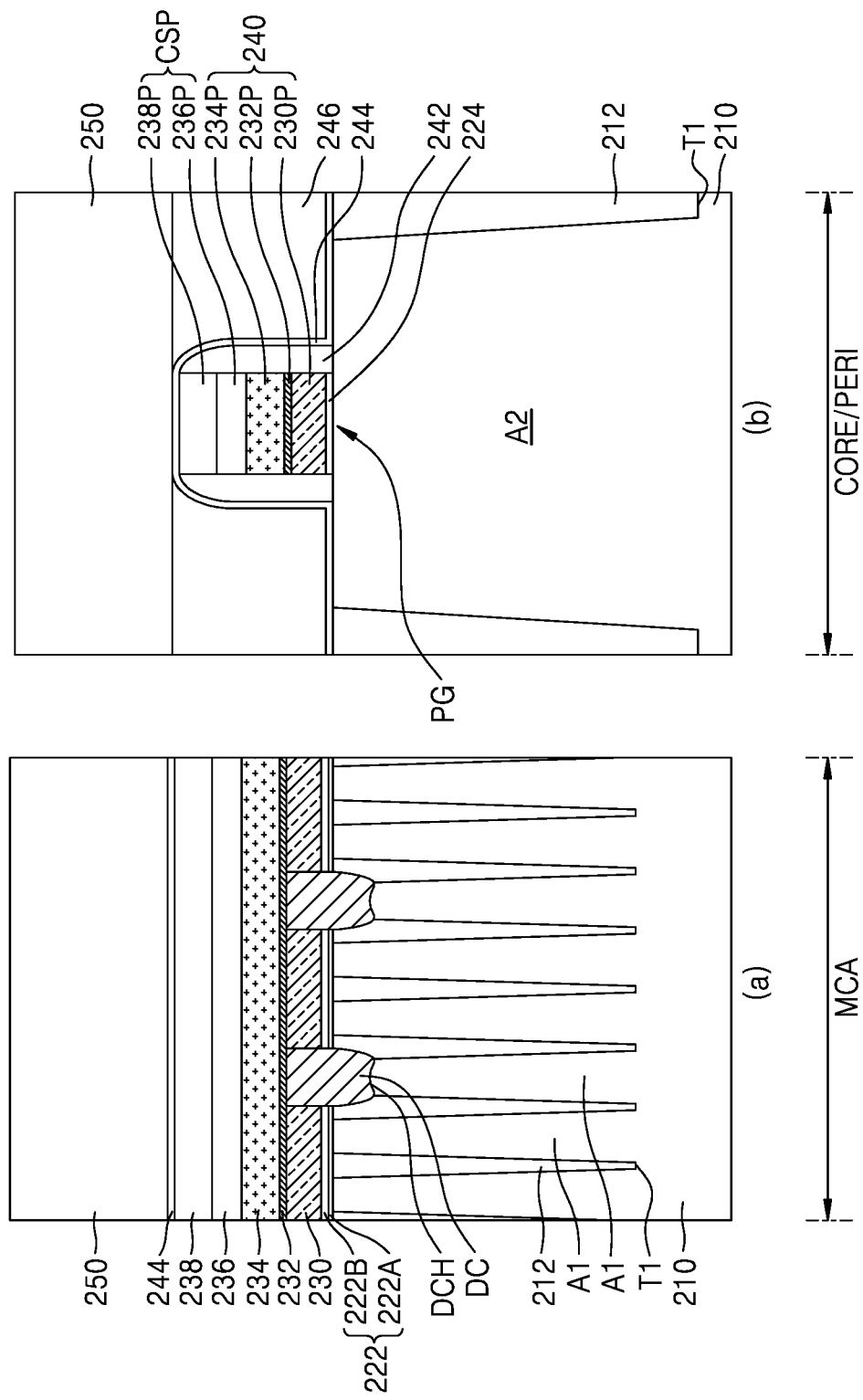
Figure 8K:
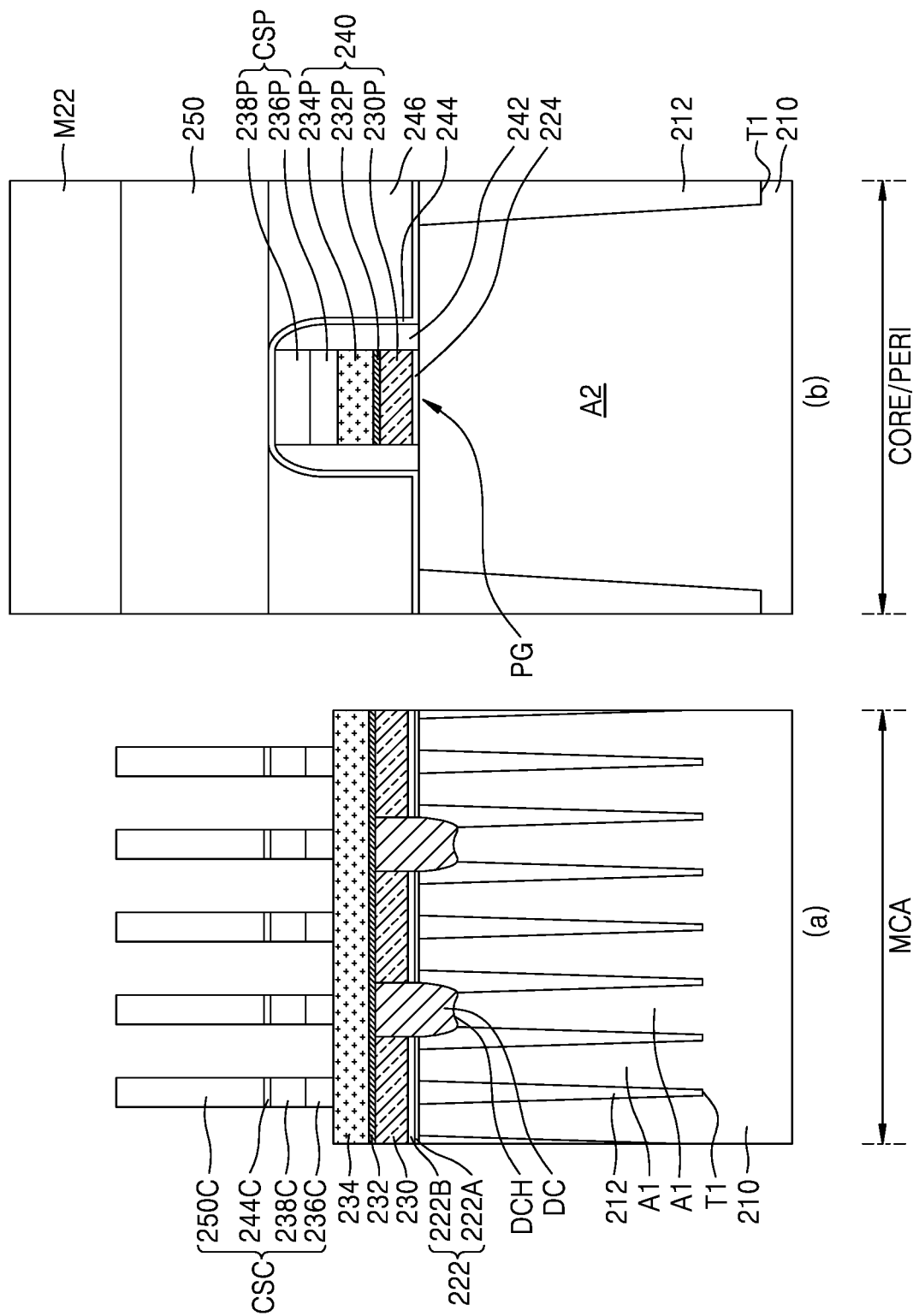
Figure 8L:
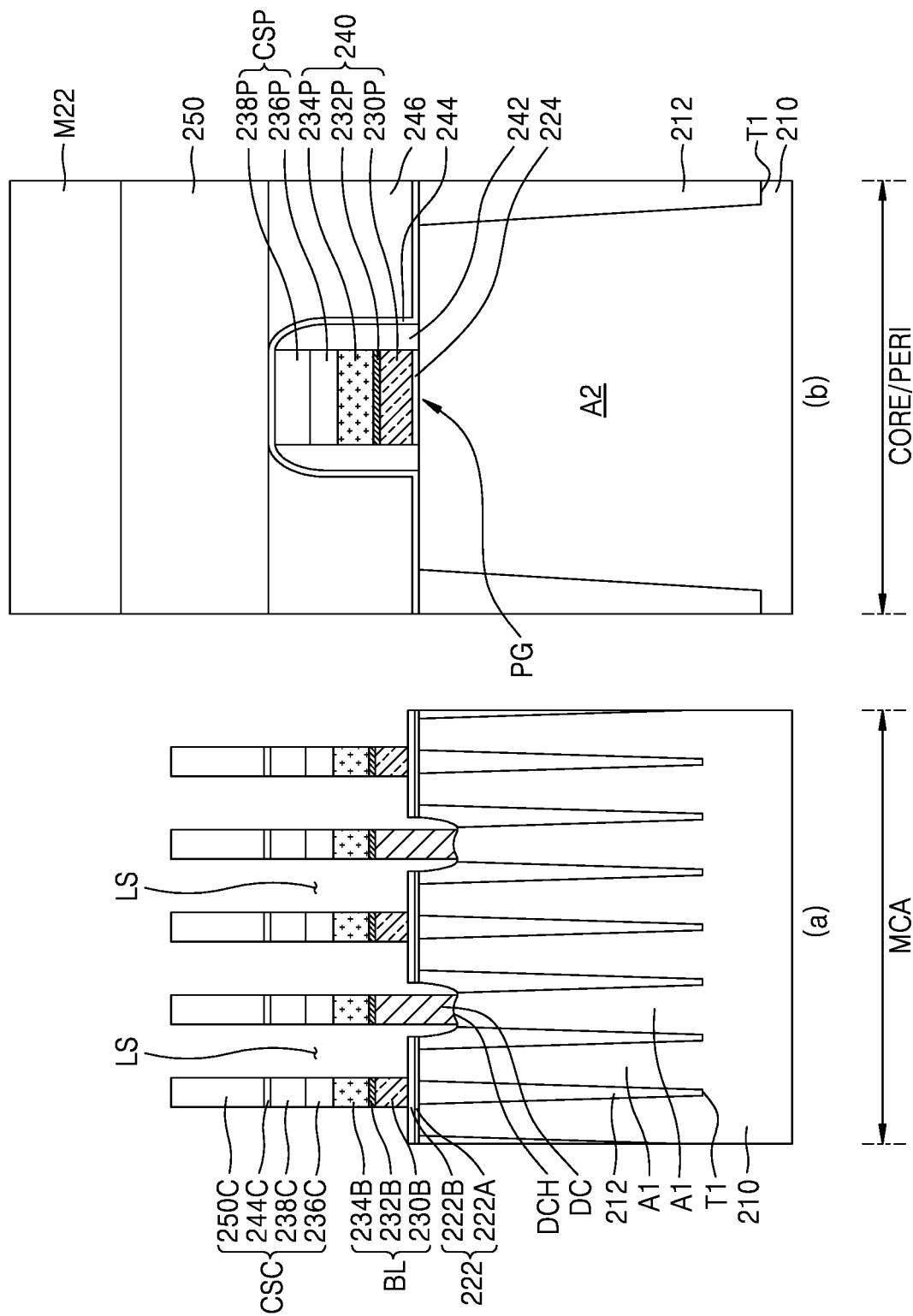
Figure 8N:
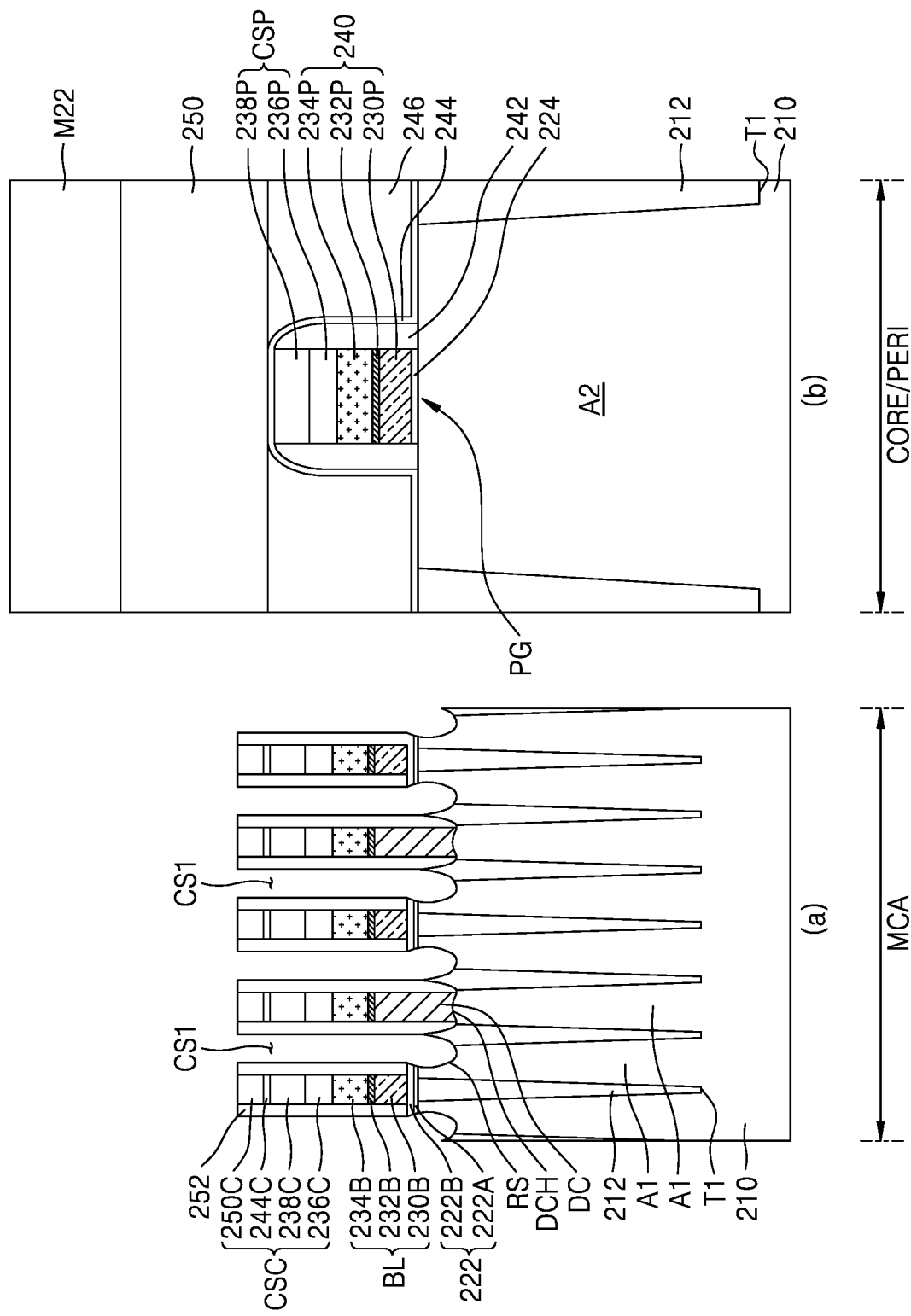
Figure 80:
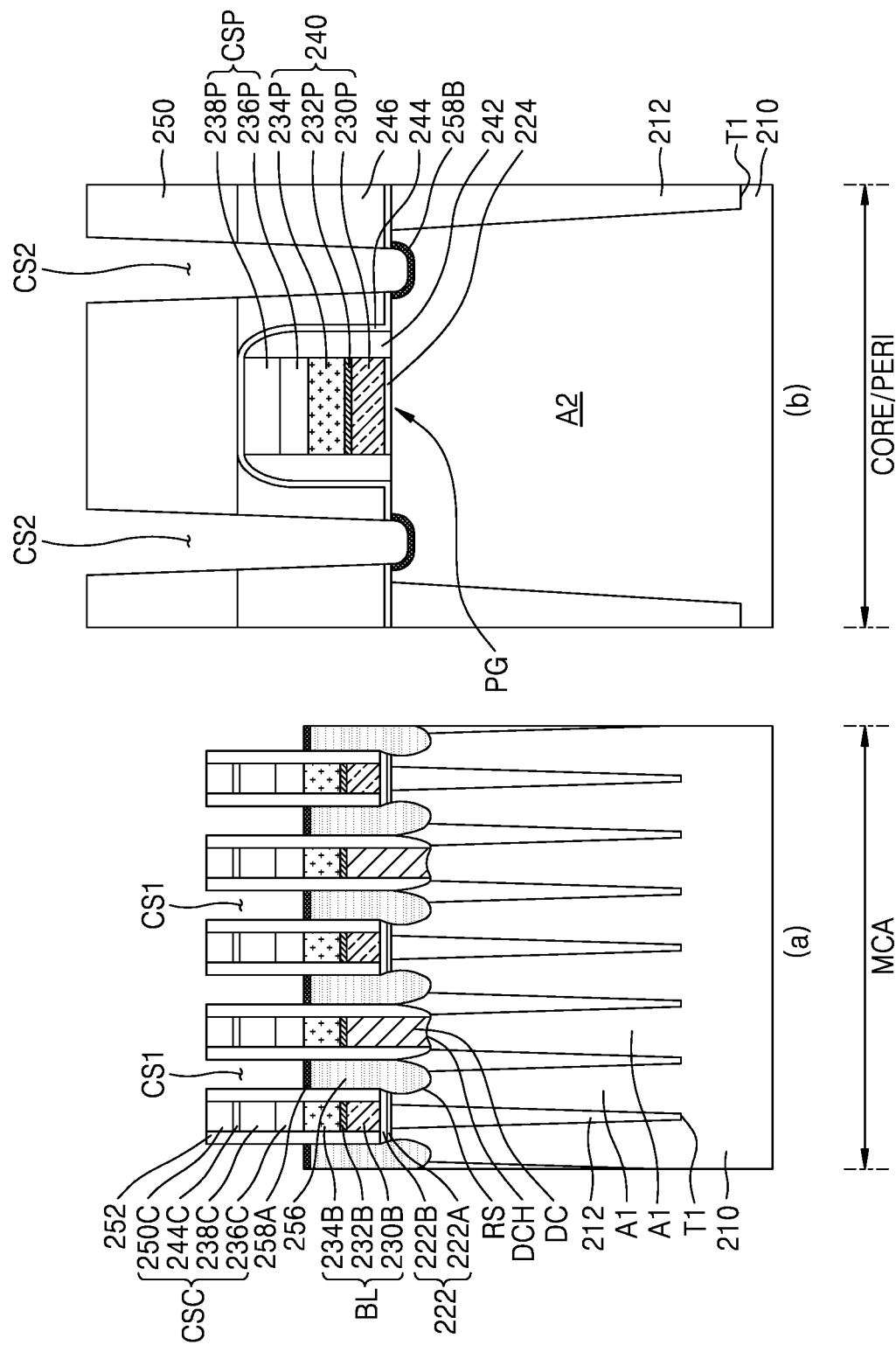
Figure 8P:
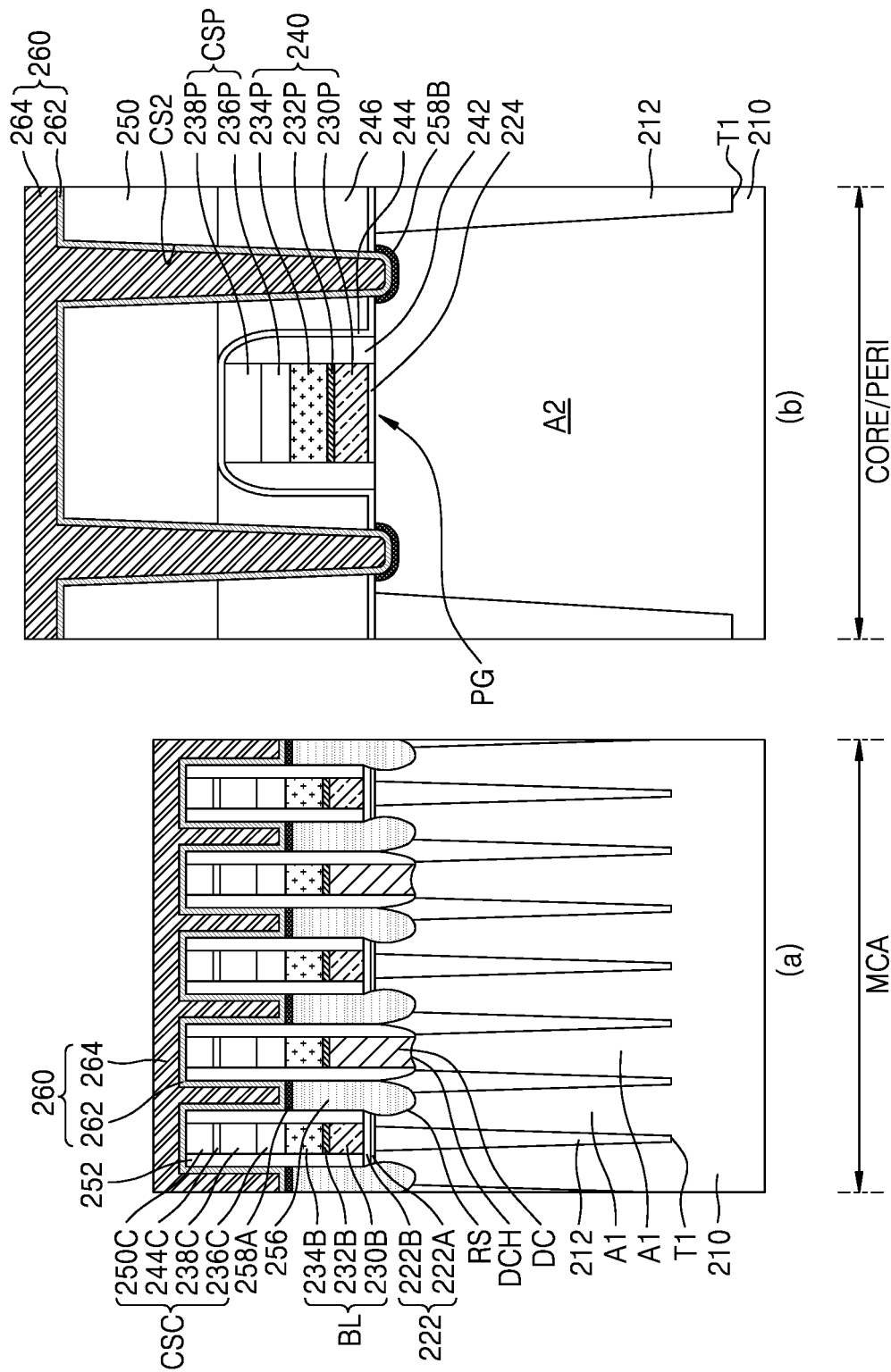
Figure 8Q:
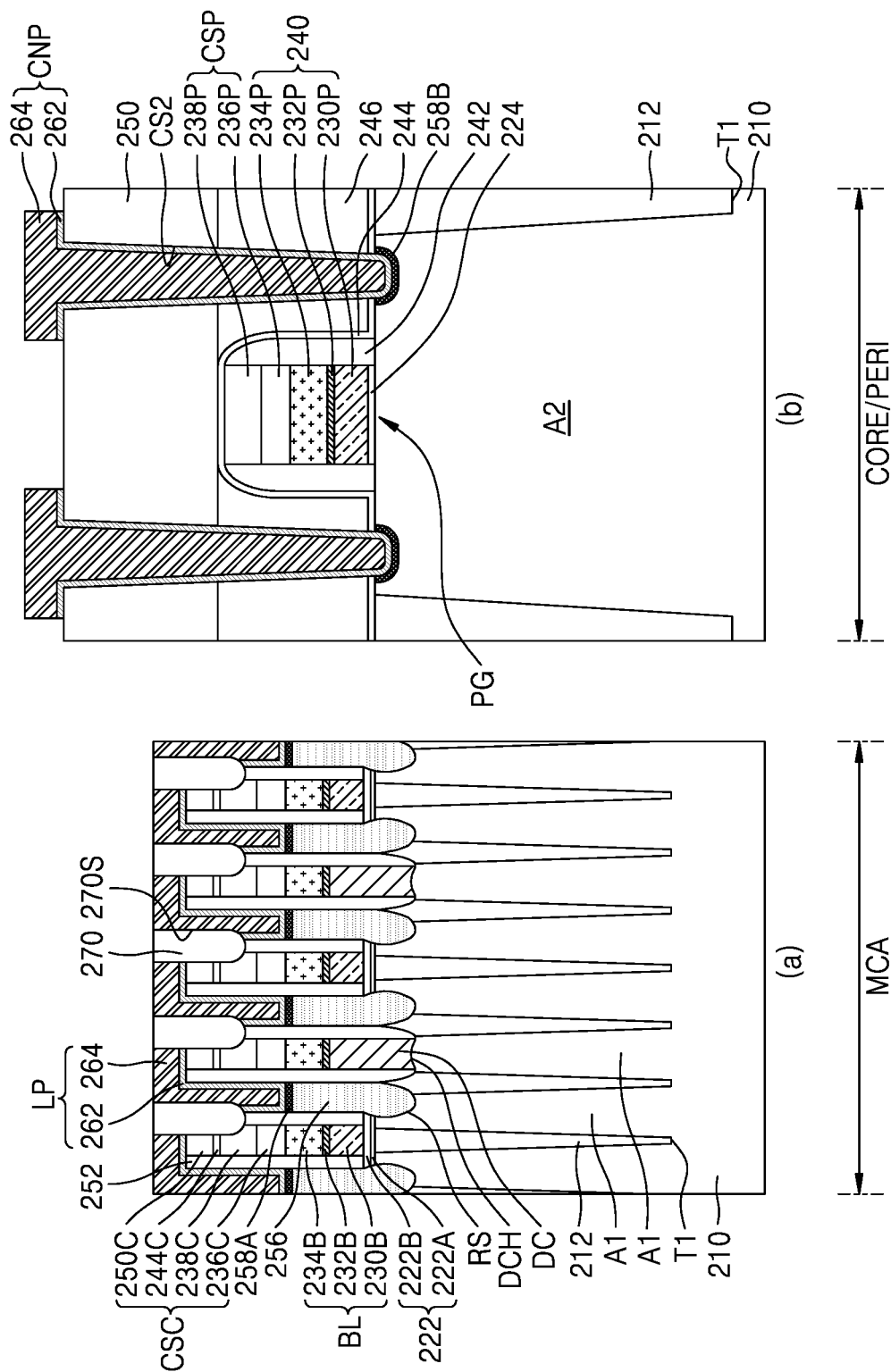

FIGS. 8A to 8Q are cross-sectional views for describing, in a processing order, a method of manufacturing an integrated circuit device according to one or more embodiments. The method of manufacturing the integrated circuit device 200 illustrated with reference to FIGS. 4A to 4C will be described below with reference to FIGS. 8A to 8Q. In FIGS. 8A to 8Q, (a) denotes cross-sectional views taken along line A-A' of FIG. 3 according to a manufacturing order, and (b) denotes cross-sectional views taken along line B-B' of FIG. 3 according to a processing order.

Referring to FIG. 8A, a plurality of isolation trenches T1 and a plurality of isolation layers 212 filling the plurality of isolation trenches T1 are formed in the substrate 210 having the cell array area MCA and the peripheral circuit area CORE/PERI. The plurality of isolation layers 212 may define the plurality of cell active areas A1 in the cell array area MCA of the substrate 210 and define the peripheral active area A2 in the peripheral circuit area CORE/PERI.

A plurality of word line trenches T2 (see FIG. 4B) that extend in parallel with one another may be formed in the substrate 210 in the cell array area MCA. In order to form the plurality of word line trenches T2 having steps on bottom surfaces thereof, the isolation layer 212 and the substrate 210 are etched through separate etching processes to differentiate an etched depth of the isolation layer 212 from an etched depth of the substrate 210. After cleaning the resulting structure having the plurality of word line trenches T2, the plurality of gate dielectric layers 216, the plurality of gate lines 218, and the plurality of buried insulating layers 220 may be sequentially formed in the plurality of word line trenches T2. Impurity ions are implanted into opposite sides of the plurality of gate lines 218 in the plurality of cell active areas A1 to form a plurality of source/drain regions on the plurality of cell active areas A1. In one or more embodiments, the plurality of source/drain regions may be formed before forming the plurality of gate lines 218.

After that, the buffer layer 222 is formed on the substrate 210 in the cell array area MCA, and the gate dielectric layer 224 is formed on the substrate 210 in the peripheral circuit area CORE/PERI.

Referring to FIG. 8B, the lower conductive layer 230 is formed on the buffer layer 222 in the cell array area MCA and on the gate dielectric layer 224 in the peripheral circuit area CORE/PERI. The lower conductive layer 230 may include doped polysilicon.

Referring to FIG. 8C, a mask pattern M21 is formed on the lower conductive layer 230, and after that, the lower conductive layer 230 exposed through an opening M210 of the mask pattern M21 is etched in the cell array area MCA. Then, an exposed part of the substrate 210 as a result of the etching and a part of the isolation layer 212 are etched to form direct contact holes DCH that expose the cell active areas A1 of the substrate 210. The mask pattern M21 may include an oxide layer, a nitride layer, or a combination thereof. A photolithography process may be performed to form the mask pattern M21.

Referring to FIG. 8D, the mask pattern M21 (see FIG. 8C) is removed, and a direct contact DC is formed in each of the direct contact holes DCH.

In an exemplary process for forming the direct contact DC, a conductive layer is formed in the direct contact hole DCH and on an upper portion of the lower conductive layer 230 to a thickness that is sufficient enough to fill the direct contact hole DCH, and the conductive layer may be etched-back only to remain in the direct contact hole DCH. The conductive layer may include Si, Ge, W, WN, Co, Ni, Al, Mo, Ru, Ti, TiN, Ta, TaN, Cu, or a combination thereof.

Referring to FIG. 8E, the intermediate conductive layer 232 and the upper conductive layer 234 are sequentially formed on the lower conductive layer 230 and the direct contact DC in the cell array area MCA and the peripheral circuit area CORE/PERI. Each of the intermediate conductive layer 232 and the upper conductive layer 234 may include TiN, TiSiN, W, tungsten silicide, or a combination thereof. In one or more embodiments, the intermediate conductive layer 232 includes TiN, TiSiN, or a combination thereof, and the upper conductive layer 234 may include W.

Referring to FIG. 8F, a first insulation capping layer 236 is formed on the upper conductive layer 234 in the cell array area MCA and the peripheral circuit area CORE/PERI.

In order to form the first insulation capping layer 236, a chemical vapor deposition (CVD) or an atomic layer deposition (ALD) process may be performed under a first temperature that is relatively low temperature. The first temperature may be selected within a range of about 500° C. to about 700° C. For example, the first temperature may be selected within a range of about 600° C. to about 650° C. The first insulation capping layer 236 may include a silicon nitride layer. In this case, in the CVD or ALD process for forming the first insulation capping layer 236, a gas including $SiH_4$, $Si_2Cl_2H_2$, $SiH_6$, $Si_2H_6$, $Si_3H_8$, or a combination thereof is used as a Si-containing precursor, and a gas including $NH_3$, $N_2$, NO, $N_2O$, or a combination thereof may be used as an N-containing precursor. However, one or more embodiments are not limited to the above examples.

Since the deposition process is performed at the first temperature that is relatively low when the first insulation capping layer 236 is formed, forming of WN due to a reaction between the nitrogen (N)-containing precursor and the metal included in the upper conductive layer 234, e.g., W during the forming of the first insulation capping layer 236 or undesired diffusion of the N atoms from the first insulation capping layer 236 to the upper conductive layer 234 may be restrained. Therefore, forming of insulating metal nitride, e.g., WN, between the upper conductive layer 234 and the first insulation capping layer 236 may be restrained or reduced.

In one or more embodiments, N atoms included in the first insulation capping layer 236 may be diffused to the upper conductive layer 234 during the forming of the first insulation capping layer 236. As a result, after forming the first insulation capping layer 236, a nitrogen atom diffusion area may be formed from an interface between the first insulation capping layer 236 and the upper conductive layer 234 over a part of the thickness in the upper conductive layer 234. Detailed structure of the nitrogen atom diffusion area is described above with reference to FIGS. 4A to 4C.

Referring to FIG. 8G, the second insulation capping layer 238 is formed on the first insulation capping layer 236 in the cell array area MCA and the peripheral circuit area CORE/PERI.

In order to form the second insulation capping layer 238, a CVD or ALD process may be performed at a second temperature that is relatively high temperature. The second temperature is higher than the first temperature. For example, the second temperature may be selected within a range of about 700° C. to about 800° C. The second insulation capping layer 238 may include a silicon nitride layer. In this case, the method of forming the second insulation capping layer 238 is the same as the method of forming the first insulation capping layer 236 described above with reference to FIG. 8F.

The process of forming the first insulation capping layer 236 described above with reference to FIG. 8F and the process of forming the second insulation capping layer 238 described above with reference to FIG. 8G may be performed in-situ or ex-situ. In an embodiment, in order to successively form the first insulation capping layer 236 and the second insulation capping layer 238 in-situ in the same chamber, the first insulation capping layer 236 and the second insulation capping layer 238 may be respectively formed by the CVD process, and a deposition temperature of the first insulation capping layer 236 may be less than the deposition temperature of the second insulation capping layer 238. In another embodiment, in order to form the first insulation capping layer 236 and the second insulation capping layer 238 ex-situ, the first insulation capping layer 236 may be formed by the ALD process at the first temperature that is relatively low and the second insulation capping layer 238 may be formed by the CVD process at the second temperature that is relatively high.

Since the deposition temperature of the second insulation capping layer 238 is higher than the deposition temperature when the first insulation capping layer 236 is formed, a density of the second insulation capping layer 238 may be greater than a density of the first insulation capping layer 236.

Referring to FIG. 8H, in the peripheral circuit area CORE/PERI, the gate dielectric layer 224, the lower conductive layer 230, the intermediate conductive layer 232, the upper conductive layer 234, the first insulation capping layer 236, and the second insulation capping layer 238 are patterned by using a mask pattern (not shown) as an etching mask, and then the gate structure PG including the gate dielectric layer 224, the gate electrode 240, the first insulation capping pattern 236P, and the second insulation capping pattern 238P is formed in the peripheral circuit area CORE/PERI. The gate electrode 240 may include a lower conductive pattern 230P, an intermediate conductive pattern 232P, and an upper conductive pattern 234P.

Referring to FIG. 8I, the insulation spacers 242 are formed on opposite side walls of the gate structure PG in the peripheral circuit area CORE/PERI, and an ion implantation process is performed for forming the source/drain regions in the peripheral active area A2 at opposite sides of the gate structure PG.

After that, the insulation thin film 244 is formed to entirely cover exposed surfaces of the cell array area MCA and the peripheral circuit area CORE/PERI. The insulation thin film 244 may be in contact with the upper surface of the second insulation capping layer 238 in the cell array area MCA and may be in contact with the upper surface of the second insulation capping pattern 238P in the peripheral circuit area CORE/PERI. The insulation thin film 244 may be formed by a process that is the same as or similar to the process of forming the second insulation capping layer 238 described above with reference to FIG. 8G.

In the peripheral circuit area CORE/PERI, the interlayer insulating layer 246 filling a space around the gate structure PG and the insulation thin film 244 is formed. The interlayer insulating layer 246 may have a planarized upper surface.

Referring to FIG. 8J, the third insulation capping layer 250 is formed on the insulation thin film 244 and the interlayer insulating layer 246 that is planarized in the cell array area MCA and the peripheral circuit area CORE/PERI. The third insulation capping layer 250 may be formed by a process that is the same as or similar to the process of forming the second insulation capping layer 238 described above with reference to FIG. 8G.

Referring to FIG. 8K, in a state in which the third insulation capping layer 250 is covered with a mask pattern M22 in the peripheral circuit area CORE/PERI, the third insulation capping layer 250, the insulation thin film 244, the second insulation capping layer 238, and the first insulation capping layer 236 are patterned by a photolithography process in the cell array area MCA, and then a plurality of insulation capping structures CSC each including the first insulation capping pattern 236C, the second insulation capping pattern 238C, the insulation thin film pattern 244C, and the third insulation capping pattern 250C sequentially stacked on the upper conductive layer 234 are formed.

Referring to FIG. 8L, in a state in which the third insulation capping layer 250 is covered with the mask pattern M22 in the peripheral circuit area CORE/PERI, the upper conductive layer 234, the intermediate conductive layer 232, and the lower conductive layer 230 are etched by using the plurality of insulation capping structures CSC as an etching mask in the cell array area MCA, and then the plurality of bit lines BL each including the lower conductive pattern 230B, the intermediate conductive pattern 232B, and the upper conductive pattern 234B are formed. The resulting structure with the plurality of bit lines BL may be cleaned and dried. In one or more embodiments, the cleaning process of the resulting structure with the plurality of bit lines BL may be performed by using diluted HF (DHF). The drying process may be performed by using isopropyl alcohol (IPA). After forming the plurality of bit lines BL, a line space LS may remain between the bit lines BL. The height of the third insulation capping pattern 250C in the insulation capping structures CSC may be reduced due to the etching process for the forming of the plurality of bit lines BL.

Referring to FIG. 8M, the plurality of insulation spacers 252 are formed to cover side walls of the plurality of bit lines BL and the plurality of insulation capping structures CSC. The plurality of insulation spacers 252 may fill the direct contact holes DCH around the direct contacts DC.

Referring to FIG. 8N, in a state in which the third insulation capping layer 250 is covered with the mask pattern M22 in the peripheral circuit area CORE/PERI, the plurality of insulating fences 254 (see FIG. 4B) are formed respectively between the plurality of bit lines BL in the cell array area MCA to divide the line space LS into a plurality of contact spaces CS1. The plurality of insulating fences 254 may each overlap the gate line 218 in the vertical direction. One line space LS may be divided by the plurality of insulating fences 254 so that the plurality of contact spaces CS1 each may have a pillar shape. After that, structures exposed through the plurality of contact spaces CS1 may be partially removed to form a plurality of recessed spaces RS, each of which exposes the cell active areas A1 of the substrate 210 between the bit lines BL. While the plurality of insulating fences 254 and the plurality of recessed spaces RS are formed, the third insulation capping pattern 250C and the insulation spacers 252 are exposed to various etching process atmosphere, and heights of the third insulation capping pattern 250C and the insulation spacers 252 may be further reduced.

Referring to FIG. 8O, in a state in which the third insulation capping layer 250 is covered with the mask pattern M22 (see FIG. 8M) in the peripheral circuit area CORE/PERI, the plurality of conductive plugs 256 are formed in the cell array area MCA, wherein the plurality of conductive plugs 256 respectively fill the plurality of recessed spaces RS between the bit lines BL and partially fill the contact spaces CS1 between the bit lines BL.

The mask pattern M22 (see FIG. 8N) is removed to expose the third insulation capping layer 250 in the peripheral circuit area CORE/PERI, and after that, the third insulation capping layer 250, the interlayer insulating layer 246, and the insulation thin film 244 are etched in the peripheral circuit area CORE/PERI in a state in which a mask pattern (not shown) covers the cell array area MCA, so as to form a plurality of contact spaces CS2 that expose the peripheral active area A2 on the substrate 210. After that, the mask pattern (not shown) covering the cell array area MCA is removed, and then, a metal silicide layer 258A is formed on the conductive plugs 256 that are exposed through the plurality of contact spaces CS1 in the cell array area MCA and a metal silicide layer 258B is formed on surfaces of the peripheral active area A2 exposed through the plurality of contact spaces CS2 in the peripheral circuit area CORE/PERI. In one or more embodiments, the metal silicide layers 258A and 258B may be simultaneously formed. In another embodiment, the metal silicide layers 258A and 258B may be formed through separate processes from each other.

Referring to FIG. 8P, the conductive layer 260 covers exposed surfaces on the substrate 210 in the cell array area MCA and the peripheral circuit area CORE/PERI. The conductive layer 260 may include a conductive barrier layer 262 and a main conductive layer 264.

Referring to FIG. 8Q, the conductive layer 260 is patterned in the cell array area MCA and the peripheral circuit area CORE/PERI, and then the plurality of conductive landing pads LP are formed from the conductive layer 260 in the cell array area MCA and the plurality of conductive patterns CNP are formed from the conductive layer 260 in the peripheral circuit area CORE/PERI. The plurality of conductive landing pads LP may be disposed on the metal silicide layer and may partially overlap the plurality of bit lines BL in a vertical direction.

According to the method of manufacturing the integrated circuit device 200 described above with reference to FIGS. 8A to 8Q, when the plurality of insulation capping structures CSC covering the plurality of bit lines BL are formed, the first insulation capping layer 236 that is directly on the bit lines BL in the insulation capping structure CSC is formed at a relatively low temperature so as to restrain or reduce the forming of an undesired insulating metal nitride layer at the interface between the plurality of bit lines BL and the insulation capping structures CSC. Therefore, increase in the resistance of the plurality of bit lines BL may be reduced.

Figure 9A:
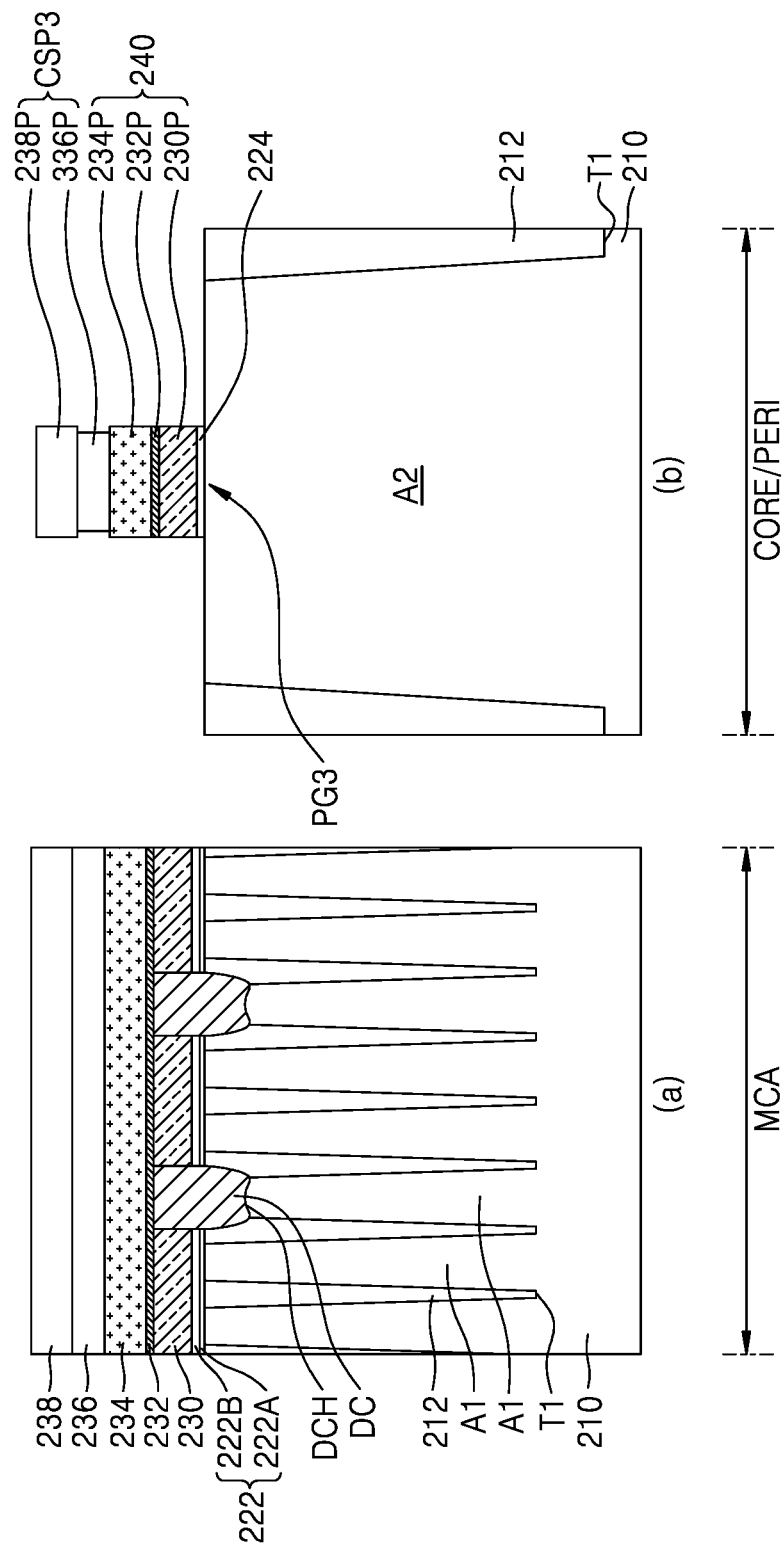
FIGS. 9A to 9C are cross-sectional views for describing, in a processing order, a method of manufacturing an integrated circuit device according to one or more embodiments.
Figure 9B:
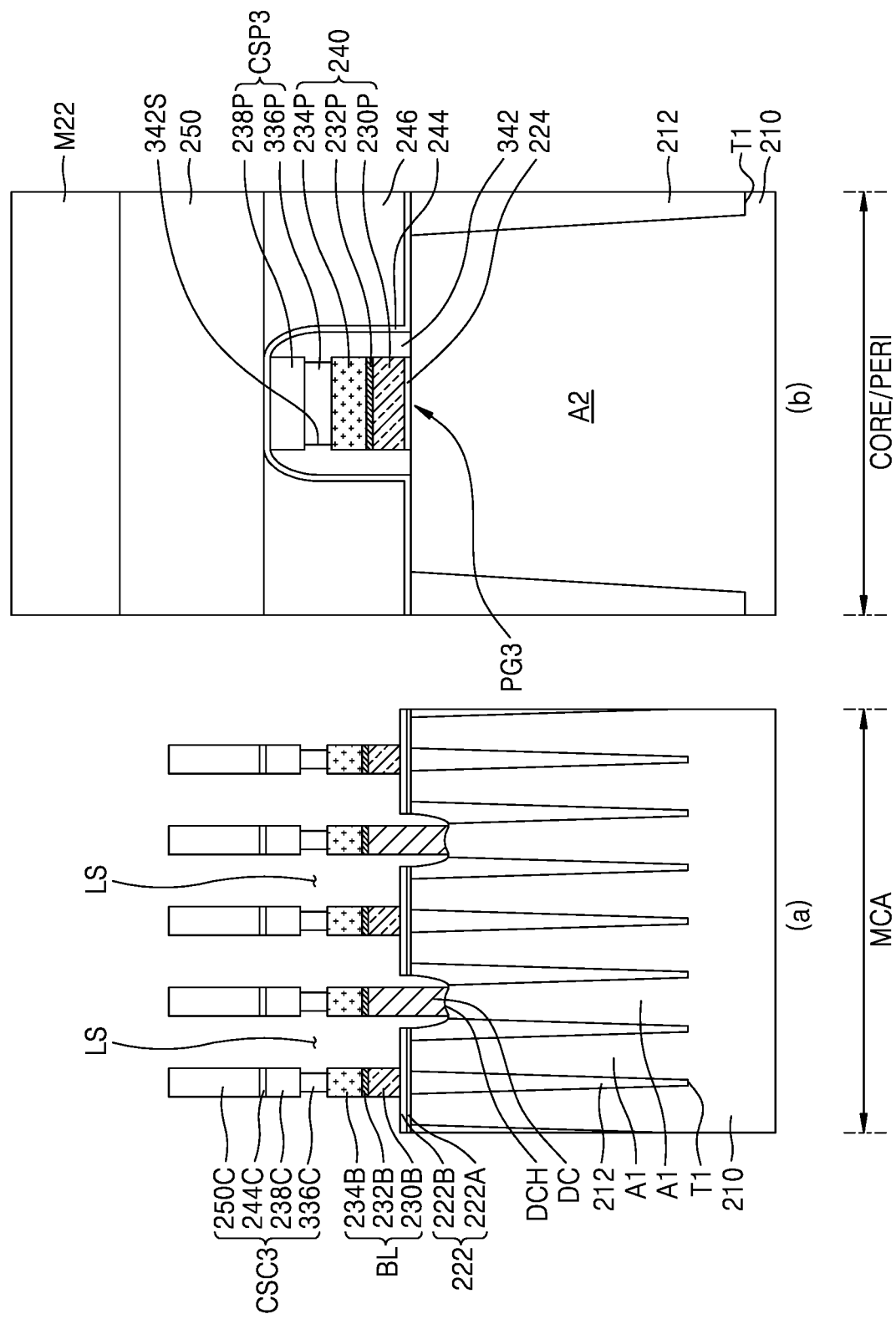
Figure 9C:
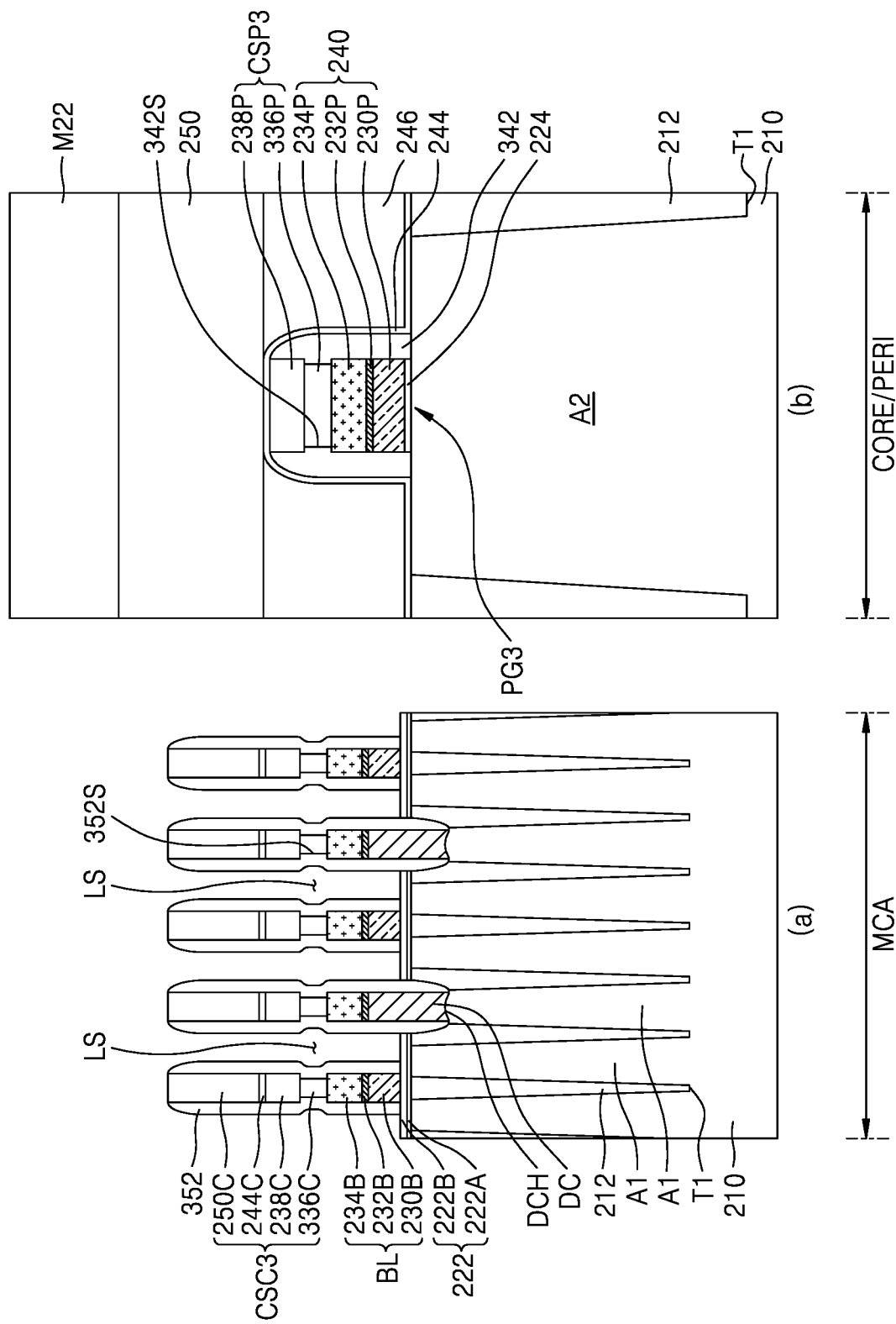

FIGS. 9A to 9C are cross-sectional views for describing, in a processing order, a method of manufacturing the integrated circuit device 300 according to one or more embodiments. The method of manufacturing the integrated circuit device 300 illustrated with reference to FIGS. 6A to 6C will be described below with reference to FIGS. 9A to 9C. In FIGS. 9A to 9C, (a) denotes cross-sectional views taken along line A-A' of FIG. 3 according to manufacturing order, and (b) denotes cross-sectional views taken along line B-B' of FIG. 3 according to processing order.

Referring to FIG. 9A, the gate structure PG3 including the gate dielectric layer 224, the gate electrode 240, the first insulation capping pattern 236P, and the second insulation capping pattern 238P is formed in the peripheral circuit area CORE/PERI in the same manner as that described above with reference to FIGS. 8A to 8H. After that, exposed side walls of the first insulation capping pattern 236P are partially removed by a selective etching process that uses a difference between densities of the first insulation capping pattern 236P and the second insulation capping pattern 238P, and then the first insulation capping pattern 336P having a minimum width that is less than that of the second insulation capping pattern 238P is formed. An etchant such as DHF may be used to perform the selective etching process for forming the first insulation capping pattern 336P.

Referring to FIG. 9B, processes for forming the plurality of insulation capping structures CSCS and the plurality of bit lines BL in the cell array area MCA are performed on a resulting structure of FIG. 9A according to the manufacturing processes described above with reference to FIGS. 8I to 8L. However, in the embodiment, in the process described above with reference to FIG. 8I, the insulation spacer 342 having protruding side walls 342S that protrude towards the first insulation capping pattern 336P is formed.

After that, in the cell array area MCA, the exposed side walls of the first insulation capping pattern 236C of FIG. 8K are partially removed to form the first insulating capping pattern 336C by a selective etching process that uses a difference between the density of the first insulation capping pattern 236C of FIG. 8K and the densities of the second insulation capping pattern 238C, the insulation thin film pattern 244C, and the third insulation capping pattern 250C in the insulation capping structures CSC. The first insulation capping pattern 336C has a minimum width less than that of the second insulation capping pattern 238C. An etchant such as DHF may be used to perform the selective etching process for forming the first insulation capping pattern 336C.

Referring to FIG. 9C, the process described above with reference to FIG. 8M may be performed on the resulting structure of FIG. 9B. However, instead of the plurality of insulation spacers 252 of FIG. 8M, a plurality of insulation spacers 352 having protruding side walls 352S that protrude towards the first insulation capping pattern 336C may be formed in the embodiment.

After that, the processes illustrated in FIGS. 8N to 8Q are performed on the resulting structure of FIG. 9C to manufacture the integrated circuit device 300 shown in FIGS. 6A to 6C.

According to the method of manufacturing the integrated circuit device 300 described above with reference to FIGS. 9A to 9C, when the plurality of insulation capping structures CSC3 covering the plurality of bit lines BL are formed, the first insulation capping pattern 336C in the insulation capping structure CSC3, wherein the first insulation capping pattern 336C is in contact with the bit lines BL, is obtained from a film formed at a relatively low temperature. Therefore, forming of undesired insulating metal nitride layer at an interface between the plurality of bit lines BL and the insulation capping structures CSC3 may be restrained or reduced, and increase in the resistance of the plurality of bit lines BL may be prevented. Also, in the insulation capping structure CSC3, a side wall profile of the insulation capping structure CSC3 may be optimized by using the difference between the densities of the first insulation capping pattern 336C and the second insulation capping pattern 238C, and thus, volumes of a plurality of conductive structures, e.g., the plurality of conductive landing pads LP3, between the bit lines BL may be increased to restrain the increase in the resistance of the plurality of conductive structures and to improve reliability of the integrated circuit device.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a conductive line formed on a substrate, the conductive line comprising a metal layer and extending in a first horizontal direction with respect to an upper surface of the substrate;
an insulation capping structure disposed on an upper surface of the conductive line,
wherein the insulation capping structure comprises:
a first insulation capping pattern having a first density, the first insulation capping pattern being adjacent to the metal layer; and
a second insulation capping pattern vertically spaced apart from the metal layer with the first insulation capping pattern therebetween, the second insulation capping pattern having a second density that is greater than the first density; and
a contact structure including a vertical portion extending in a vertical direction with respect to the upper surface of the substrate and being spaced apart from side walls of the conductive line and side walls of the insulation capping structure in a second horizontal direction with respect to the upper surface of the substrate, the second horizontal direction being perpendicular to the first horizontal direction.

2. The integrated circuit device of claim 1, wherein
the first insulation capping pattern and the second insulation capping pattern contact each other, and
a width of the first insulation capping pattern in a second horizontal direction with respect to the upper surface of the substrate is equal to a width of the second insulation capping pattern in the second horizontal direction, the second horizontal direction being perpendicular to the first horizontal direction.

3. The integrated circuit device of claim 1,
wherein the first insulation capping pattern is in contact with an entire upper surface of the metal layer,
wherein the metal layer comprises a first region doped with nitrogen atoms, the first region extending from an interface between the metal layer and the first insulation capping pattern toward the substrate and having a first thickness less than a thickness of the metal layer, and
wherein the nitrogen atoms are in a diffused state in the first region without being chemically bonded with atomic elements of the metal layer.

4. The integrated circuit device of claim 3, wherein
the first thickness of the first region of the metal layer is between 5 Å to 40 Å.

5. The integrated circuit device of claim 1, wherein
a bottom surface of the first insulation capping pattern is in contact with an upper surface of the metal layer, and
a bottom surface of the second insulation capping pattern is in contact with an upper surface of the first insulation capping pattern.

6. The integrated circuit device of claim 1, wherein
the first insulation capping pattern and the second insulation capping pattern each comprise a silicon nitride layer.

7. The integrated circuit device of claim 1, wherein
the first insulation capping pattern comprises a silicon carbonitride layer and the second insulation capping pattern comprises a silicon nitride layer.

8. The integrated circuit device of claim 1, wherein
the conductive line comprises a lower conductive pattern, an intermediate conductive pattern, and an upper conductive pattern that are sequentially stacked on the substrate, and
the lower conductive pattern comprises doped polysilicon, the intermediate conductive pattern comprises TiN, TiSiN, or a combination thereof, and the upper conductive pattern comprises tungsten (W).

9. An integrated circuit device comprising:
a pair of bit lines extending on a substrate in parallel to each other in a first horizontal direction with respect to an upper surface of the substrate, the pair of bit lines being adjacent to each other in a second horizontal direction with respect to the upper surface of the substrate;
a pair of insulation capping structures contacting the pair of bit lines, respectively; and
a contact structure including a vertical portion extending in a vertical direction from a region between the pair of bit lines to a region between the pair of insulation capping structures, wherein the vertical portion is spaced apart from each of the pair of bit lines and each of the pair of insulation structures,
wherein the pair of bit lines each comprise a metal layer, and
each of the pair of insulation capping structures comprises:
a first insulation capping pattern on the metal layer, the first insulation capping pattern having a first density; and
a second insulation capping pattern spaced apart from the metal layer with the first insulation capping pattern therebetween, the second insulation capping pattern having a second density that is greater than the first density.

10. The integrated circuit device of claim 9, wherein,
in at least one of the pair of insulation capping structures, a width of the first insulation capping pattern in the second horizontal direction is equal to a width of the second insulation capping pattern in the second horizontal direction.

11. The integrated circuit device of claim 9, wherein
the first insulation capping pattern is in contact with the metal layer, and
the metal layer comprises a tungsten (W) layer that is in contact with the first insulation capping pattern, the tungsten (W) layer comprising tungsten (W) atoms and nitrogen (N) atoms, the nitrogen (N) atoms being distributed among the tungsten (W) atoms of a partial area, in contact with the first insulation capping pattern, of the tungsten (W) layer without any chemical reaction with the tungsten (W) atoms, and tungsten nitride particles distributed in the tungsten (W) layer.

12. The integrated circuit device of claim 9, wherein,
in at least one of the pair of insulation capping structures, a bottom surface of the first insulation capping pattern is in contact with an upper surface of the metal layer and
a bottom surface of the second insulation capping pattern is in contact with an upper surface of the first insulation capping pattern.

13. The integrated circuit device of claim 9, wherein,
in the pair of insulation capping structures, each of the first insulation capping pattern and the second insulation capping pattern comprises a silicon nitride layer.

14. The integrated circuit device of claim 9, wherein,
in the pair of insulation capping structures, the first insulation capping pattern comprises a silicon carbonitride layer, and
the second insulation capping pattern comprises a silicon nitride layer.

15. The integrated circuit device of claim 9, further comprising
a contact structure between the pair of insulation capping structures.

16. An integrated circuit device comprising:
a substrate comprising a cell array area and a peripheral circuit area;
a bit line on the substrate in the cell array area, the bit line comprising a first metal layer;
a first insulation capping structure covering the bit line in the cell array area;
a gate electrode on the substrate in the peripheral circuit area, the gate electrode comprising a second metal layer; and
a second insulation capping structure covering the gate electrode in the peripheral circuit area,
wherein each of the first insulation capping structure and the second insulation capping structure comprises:
a first insulation capping pattern having a first density; and
a second insulation capping pattern spaced apart from the substrate with the first insulation capping pattern therebetween, the second insulation capping pattern having a second density that is greater than the first density, and
the first metal layer and the second metal layer are in contact with the first insulation capping pattern included in the first insulation capping structure and the first insulation capping pattern included in the second insulation capping structure, respectively, and
the first metal layer comprises a first region doped with nitrogen (N) atoms, the first region extending from an interface between the first metal layer and the first insulation capping pattern in the first insulation capping structure toward the substrate and having a first thickness less than a thickness of the first metal layer.

17. The integrated circuit device of claim 16, wherein
the first region of the first metal layer has a thickness between 5 Å to 40 Å.

18. The integrated circuit device of claim 16, wherein
the first metal layer comprises a tungsten (W) layer that is in contact with the first insulation capping pattern in the first insulation capping structure,
the tungsten (W) layer comprising nitrogen (N) atoms and tungsten (W) atoms, the nitrogen (N) atoms being distributed among the tungsten (W) atoms of a partial area, in contact with the first insulation capping pattern, of the W layer without any chemical reaction with the tungsten (W) atoms, and tungsten nitride particles distributed in the W layer.

19. The integrated circuit device of claim 16, wherein
a bottom surface of the second insulation capping pattern is in contact with an upper surface of the first insulation capping pattern,
the first insulation capping pattern comprises a silicon nitride layer, a silicon carbonitride layer, or a combination thereof, and
the second insulation capping pattern comprises a silicon nitride layer.

20. The integrated circuit device of claim 1,
wherein an insulation capping structure is disposed on the upper surface of the conductive line without covering side walls of the conductive line.

* * * * *